United States Patent
Yu et al.

(10) Patent No.: US 11,528,490 B2
(45) Date of Patent: Dec. 13, 2022

(54) INFORMATION PRESERVING CODING AND DECODING METHOD AND DEVICE

(71) Applicant: Zhejiang University, Hangzhou (CN)

(72) Inventors: Lu Yu, Hangzhou (CN); Zhichu He, Hangzhou (CN)

(73) Assignee: ZHEJIANG UNIVERSITY, Hangzhou (CN)

(*) Notice: Subject to any disclaimer, the term of this patent is extended or adjusted under 35 U.S.C. 154(b) by 0 days.

(21) Appl. No.: 17/047,207

(22) PCT Filed: Apr. 15, 2019

(86) PCT No.: PCT/CN2019/082644
§ 371 (c)(1),
(2) Date: Oct. 13, 2020

(87) PCT Pub. No.: WO2019/196956
PCT Pub. Date: Oct. 17, 2019

(65) Prior Publication Data
US 2021/0044810 A1 Feb. 11, 2021

(30) Foreign Application Priority Data
Apr. 13, 2018 (CN) .......................... 201810333958.0

(51) Int. Cl.
*H04N 19/184* (2014.01)
*H04N 19/70* (2014.01)
(52) U.S. Cl.
CPC ........... *H04N 19/184* (2014.11); *H04N 19/70* (2014.11)
(58) Field of Classification Search
CPC .................................................. H04N 19/184
(Continued)

(56) References Cited

U.S. PATENT DOCUMENTS

2002/0176494 A1  11/2002  Zhao et al.
2006/0239348 A1*  10/2006  Zhang ................. H04N 19/105
                                                        375/240.12
(Continued)

FOREIGN PATENT DOCUMENTS

CN    101198055 A    6/2008
CN    103248367 A    8/2013
CN    104869397 A    8/2015

OTHER PUBLICATIONS

Chuang et al., "A Lossless Color Image Compression Algorithm with Adaptive Arithmetic Coding Based on Adjacent Data Probability," 2012 International Symposium on Computer, Consumer and Control, pp. 141-145, 5 pages.

(Continued)

*Primary Examiner* — Yulin Sun
(74) *Attorney, Agent, or Firm* — Muncy, Geissler, Olds & Lowe, P.C.

(57) ABSTRACT

The invention provides an information preserving coding method based on possibility distribution of value of a sample. The possibility distribution of value of a sample refers to evaluation of the possibility of various values of the sample. The information preserving coding method provided is more in line with the non-stationary probability property of an actual source, and a coding code length is the overhead caused by a prediction error of the possibility distribution of value of the sample. The invention further provides multiple coding methods based on possibility distribution of value of a sample. Through improving the prediction accuracy of the possibility distribution of value of the sample, the coding efficiency is greatly improved.

13 Claims, 6 Drawing Sheets

(58) Field of Classification Search
USPC .................................................. 375/240.02
See application file for complete search history.

(56) References Cited

U.S. PATENT DOCUMENTS

| | | | | |
|---|---|---|---|---|
| 2010/0052956 | A1* | 3/2010 | Choo ...................... | H03M 7/40 |
| | | | | 341/107 |
| 2013/0195182 | A1* | 8/2013 | Kung ...................... | H04N 19/60 |
| | | | | 375/240.12 |
| 2013/0272377 | A1* | 10/2013 | Karczewicz ......... | H04N 19/463 |
| | | | | 375/240.02 |
| 2014/0294118 | A1* | 10/2014 | Baik ...................... | H04L 1/0009 |
| | | | | 375/296 |
| 2018/0199058 | A1* | 7/2018 | Lee ...................... | H04N 19/136 |

OTHER PUBLICATIONS

Tang et al., "Low Entropy Image Sequences Lossless Compression," Computer Science, vol. 41, No. 12, Dec. 2014, pp. 238-244 and 259, 8 pages.

\* cited by examiner

INFORMATION PRESERVING CODING AND DECODING METHOD AND DEVICE

TECHNICAL FIELD

The invention belongs to the field of information preserving coding, and relates to an information preserving coding and decoding method and device.

BACKGROUND ART

Coding is an essential part of signal storage and transmission. It maps a symbol or symbol string of an original file to another form of symbol or symbol string. Most frequently, n-ary symbol strings are transformed into binary symbol strings to facilitate the unified processing of a binary system. Decoding is an inverse mapping process corresponding to coding. The coding can be divided into lossy coding and lossless coding according to whether the reconstructed file after decoding is consistent with the original file. The lossless coding reconstructed file is consistent with the original file, and there is no information loss. Therefore, it is also referred to as information preserving coding.

The lossless coding theory published by Shannon in 1948 [C. E. Shannon, A mathematical theory of communication, The Bell System Technical Journal, July 1948, pp: 379-423.] opened the curtain for study of lossless compression. The lossless coding theory explored the lowest possible code rate to which a stationary source can reach. For a source with stable probability distribution\conditional probability distribution and known distribution, the lower limit of its code rate is its information entropy or conditional information entropy H(U).

Further, Shannon proposed a method of approximating information entropy or conditional information entropy H(U). According to the coding method of Shannon, it is believed that if source symbols are arranged according to their probability, that is, for a source with a symbol table of A={$a_1, a_2, \ldots, a_N$}, and corresponding probability of {$p_1, p_2, \ldots, p_N$}, through sorting such that $p_1 >= p_2 >= \ldots >= p_N$, and using $$P_k = \sum_{i=1}^{k-1} p_i$$

to correspond to the symbol $a_k$, and at the same time, using $$l_k = \left\lceil \log_2 \frac{1}{p_k} \right\rceil$$

bits to represent the first $l_k$ binary symbols after binarization of $P_k$. An average code length is the shortest at this time and satisfies $$H(U) \leq \bar{n} = \sum_{k=1}^{N} l_k * p_k < H(U) + 1$$

Further, in 1960, Elias found that there was no need to sort symbols, as long as encoder and decoder sides use a same symbol sequence in the same order, and further proposed the concept of iterative coding of multiple symbols, which is described in detail in information theory work of Abramson [Abramson, N. Information Theory and Coding McGraw-Hill, New York, 1963, pp 61-62]. The iterative coding can code multiple consecutive symbols together to form a codeword, and has no need of generating a huge code table like Huffman coding [D A Huffman, "A Method for the Construction of Minimum-Redundancy Codes[C]," Proceedings of the IRE, vol. 40, no. 9, pp. 1098-1101, September 1952.]. The concept of iterative coding laid the foundation for arithmetic coding. In 1976, R. Pasco [R. Pasco, "Source Coding Algorithms for Fast Data Compression [D]," Doctoral Dissertation, Stanford University, 1976.] and J. Rissanen [J. J Rissanen, "Generalized Draft Inequality and Arithmetic Coding [J]," IBM Journal of Research and Development, vol. 20, no. 3, pp. 198-203, May 1976.] realized finite precision arithmetic coding with a fixed-length register respectively.

The premise of Shannon's coding theory and coding method is that a source has stable probability distribution. However, an actual source often has the characteristics of non-stationary probability distribution. For example, probability distribution of a video source often changes constantly over time or content. A source consisting of syntax elements in video coding is taken as an example. If all syntax elements are taken as a random process source, since the values of different syntax elements are different, and the value range of each random variable in the random process is different, it must not be a stable random process. Therefore, the same type of syntax elements with the same value range should be combined into one source. A syntax element pred_mode_flag in the HEVC standard is taken as an example for statistics. The syntax element is used to identify whether a coding block codes in an inter-frame or intra-frame mode, so it is a binary syntax element and its possible values are $a_0$ and $a_1$. FIG. 1 counts frequencies with the value of $a_0$ in every 100 pred_mode_flags in Basketball-Drive sequence, where the frequency is get using the following formula, N=100, and Num($a_0$) is the number of pred_mode_flags with the value $a_0$:

$$Fre_{acc}\{X = a_0\} = \frac{Num(a_0)}{N}0.$$

It can be seen that the frequency changes drastically over time. Table 1 counts the frequency changes with the value of pred_mode_flag being 0 when a statistics window N is increased and all pred_mode_flags in a sequence are used as a statistics window to perform statistics. It can be seen that even if the statistics window is expanded to the whole sequence, the frequency distribution is still unstable. The frequency distribution between different sequences has very large fluctuations.

TABLE 1

| Frequency distribution changes over video contents | | | |
|---|---|---|---|
| Video content | BasketballDrive | BQTerrace | SlideShow |
| Fre($a_0$) | 85.45% | 38.13% | 99.42% |

According to the definitions of law of large numbers and probability theory, for a stationary source, when the number of sampling samples is large enough, the frequency distribution will tend to a stable value, i.e., the probability distribution $Pro_{acc}\{X=a_0\}$:

$$Pro_{acc}\{X = a_0\} = \lim_{N \to \infty} Fre_{acc}\{X = a_0\}.$$

For the video source, the frequency distribution does not converge sometimes, therefore the probability distribution does not exist or the probability distribution is unstable at this time, and the video source has very large instability. But, traditional video coding theories require stable probability distribution for coding. Therefore, in consideration of the non-stationary characteristic of the video source, the traditional coding theory and method based on the source probability distribution will not be applicable any more.

In order to solve the problem of non-stationary probability, a method of adaptive probability estimation is used in video coding [D. Marpe, H. Schwarz, T. Wiegand, Context-Based Adaptive Binary Arithmetic Coding in the H.264/AVC Video Compression Standard, IEEE Trans. Circuits Syst. Video Technol. 13 (7)(2003) 620-636]. An encoder/decoder side estimates the probability of a current symbol according to coded/decoded symbols. However, there are two problems with probability estimation: 1 for most video sources, the sources have no stable probability estimation, so the target of probability estimation cannot be set; and 2. even if we take a short-term frequency of finite length as the target of the probability estimation, that is, use frequency estimation, we cannot assess the impact of the frequency estimation. Table 2 and FIG. 2 show time-variant frequency distributions estimated by three frequency estimation methods for a specific sample sequence. For the sample sequence shown in Table 2, its accurate frequency distribution is: $Fre_{acc}(X=1)=Fre_{acc}(X=0)=0.5$. It can be seen from FIG. 2 that the frequency distribution estimation method 3 has the smallest prediction error and the fastest convergence. However, from the perspective of coding performance, by using the frequency distribution estimated by the method 1 to perform arithmetic coding, the resulting code rate is at least 0, and by using the frequency distribution estimated by the method 2 to perform coding, the resulting code rate is at most infinite. Therefore, the coding efficiency is not related to the accuracy and degree of convergence of the frequency estimation. Even if there are scholars [J. Chen, W. Chien, M. Karczewicz, X. Li, H. Liu, A. Said, L. Zhang, X. Zhao, Further improvements to HMKTA-1.0, VCEG-AZ07. and E. Belyaev, A. Turlikov, K. Egiazarian, M. Gabbouj, An Efficient Adaptive Binary Arithmetic Coder With Low Memory Requirement, IEEE Journal of Selected Topics In Signal Processing, 7 (6)(2013) 1053-found that when using an exponential smoothing prediction method (ESP) to perform frequency estimation, the coding efficiency is related to the convergence speed of the frequency estimation, they still cannot accurately measure the accurate impact of the frequency estimation on coding efficiency.

TABLE 2

Sample sequence and frequency distributions estimated by three methods

| Sample | Value | Estimated frequency distribution | | |
|---|---|---|---|---|
| | | Method 1 | Method 2 | Method 3 |
| $X_0$ | $a^0 = 1$ | $Fre_{est}(X_0 = 1) = 1$, $Fre_{est}(X_0 = 0) = 0$ | $Fre_{est}(X_0 = 1) = 0$, $Fre_{est}(X_0 = 0) = 1$ | $Fre_{est}(X_0 = 1) = 0.8$, $Fre_{est}(X_0 = 0) = 0.2$ |
| $X_1$ | $a^1 = 0$ | $Fre_{est}(X_1 = 1) = 0$, $Fre_{est}(X_1 = 0) = 1$ | $Fre_{est}(X_1 = 1) = 1$, $Fre_{est}(X_1 = 0) = 0$ | $Fre_{est}(X_1 = 1) = 0.3$, $Fre_{est}(X_1 = 0) = 0.7$ |
| $X_2$ | $a^2 = 1$ | $Fre_{est}(X_2 = 1) = 1$, $Fre_{est}(X_2 = 0) = 0$ | $Fre_{est}(X_2 = 1) = 0$, $Fre_{est}(X_2 = 0) = 1$ | $Fre_{est}(X_2 = 1) = 0.6$, $Fre_{est}(X_2 = 0) = 0.4$ |
| $X_3$ | $a^3 = 0$ | $Fre_{est}(X_3 = 1) = 0$, $Fre_{est}(X_3 = 0) = 1$ | $Fre_{est}(X_3 = 1) = 1$, $Fre_{est}(X_3 = 0) = 0$ | $Fre_{est}(X_3 = 1) = 0.5$, $Fre_{est}(X_3 = 0) = 0.5$ |
| $X_4$ | $a^4 = 1$ | $Fre_{est}(X_4 = 1) = 1$, $Fre_{est}(X_4 = 0) = 0$ | $Fre_{est}(X_4 = 1) = 0$, $Fre_{est}(X_4 = 0) = 1$ | $Fre_{est}(X_4 = 1) = 0.5$, $Fre_{est}(X_4 = 0) = 0.5$ |
| $X_5$ | $a^5 = 0$ | $Fre_{est}(X_5 = 1) = 0$, $Fre_{est}(X_5 = 0) = 1$ | $Fre_{est}(X_5 = 1) = 1$, $Fre_{est}(X_5 = 0) = 0$ | $Fre_{est}(X_5 = 1) = 0.5$, $Fre_{est}(X_5 = 0) = 0.5$ |
| $X_6$ | $a^6 = 1$ | $Fre_{est}(X_6 = 1) = 1$, $Fre_{est}(X_6 = 0) = 0$ | $Fre_{est}(X_6 = 1) = 0$, $Fre_{est}(X_6 = 0) = 1$ | $Fre_{est}(X_6 = 1) = 0.5$, $Fre_{est}(X_6 = 0) = 0.5$ |
| $X_7$ | $a^7 = 0$ | $Fre_{est}(X_7 = 1) = 0$, $Fre_{est}(X_7 = 0) = 1$ | $Fre_{est}(X_7 = 1) = 1$, $Fre_{est}(X_7 = 0) = 0$ | $Fre_{est}(X_7 = 1) = 0.5$, $Fre_{est}(X_7 = 0) = 0.5$ |
| $X_8$ | $a^8 = 1$ | $Fre_{est}(X_8 = 1) = 1$, $Fre_{est}(X_8 = 0) = 0$ | $Fre_{est}(X_8 = 1) = 1$, $Fre_{est}(X_8 = 0) = 0$ | $Fre_{est}(X_8 = 1) = 0.5$, $Fre_{est}(X_8 = 0) = 0.5$ |
| $X_9$ | $a^9 = 0$ | $Fre_{est}(X_9 = 1) = 0$, $Fre_{est}(X_9 = 0) = 1$ | $Fre_{est}(X_9 = 1) = 0$, $Fre_{est}(X_9 = 0) = 1$ | $Fre_{est}(X_9 = 1) = 0.5$, $Fre_{est}(X_9 = 0) = 0.5$ |

SUMMARY OF THE INVENTION

The invention aims to provide an information preserving coding method based on possibility distribution of value of a sample in view of the problem that an actual source, especially a video source, has the characteristic of non-stationary probability, and also provides two methods to improve coding efficiency of the information preserving coding method based on possibility distribution of value of a sample.

In order to achieve the above objectives, the invention uses the following technical solutions: The first aspect of the invention provides an information preserving coding method, including, for a sample to be coded:

1) obtaining the sample to be coded;
2) obtaining possibility distribution of value of the sample to be coded; and
3) generating a bitstream according to the possibility distribution of value of the sample to be coded and the value of the sample to be coded.

Further, the obtaining the possibility distribution of value of the sample to be coded is: estimating the possibility distribution of value of the sample to be coded according to the value of at least one coded sample.

Further, the estimating the possibility distribution of value of the sample to be coded is: estimating possibility $Po_{est}\{X_i=a_0\}$ that the value of a sample $X_i$ to be coded is $a_0$ by using a prediction operator below and according to accurate possibility $Po_{acc}\{X_{i-d}=a_0\}$ that the value of a coded sample $X_{i-d}$ with a distance d from the sample to be coded is $a_0$:

$$Po_{est}\{X_i = a_0\} = \sum_{d=1}^{M} coeff_d \cdot Po_{acc}^d\{X_{i-d} = a_0\} + coeff_0 \cdot P_{init}(a_0),$$

where $P_{init}(a_0)$ is an initial estimated possibility that the value of the sample is $a_0$, $coeff_d$ and $coeff_0$ are weight coefficients, and d=1, 2, . . . M.

Further, the estimating the possibility distribution of value of the sample to be coded is: estimating possibility $Po_{est}\{X_i=a_0\}$ that the value of a sample $X_i$ to be coded is $a_0$ by using an exponential smoothing prediction operator below and according to accurate possibility $Po_{acc}\{X_{i-1}=a_0\}$ that the value of a coded sample $X_{i-1}$ is $a_0$ and estimated possibility $Po_{est}\{X_{i-1}=a_0\}$ that the value of the coded sample $X_{i-1}$ is $a_0$.

$$Po_{est}\{X_i = a_0\} = \begin{cases} \alpha \cdot Po_{est}\{X_{i-1} = a_0\} + (1-\alpha) \cdot Po_{acc}\{X_{i-1} = a_0\} & \text{if } i > 1 \\ P_{init}(a_0) & \text{if } i = 1 \end{cases},$$

where $P_{init}(a_0)$ is an initial estimated possibility that the value of the sample is $a_0$, and $\alpha$ is the smoothing rate.

Further, the smoothing rate is obtained by the following method:

1) carrying out statistics on correlation $R_0(d)$ between neighboring samples with a distance d from each other in a coded sample sequence:

$$R_0(d) = \frac{1}{N} \cdot \sum_{i=N}^{1} Po_{occ}\{X_i = a_0\} \cdot Po_{occ}\{X_{i-d} = a_0\},$$

where N is the length of the sample sequence, and $Po_{acc}\{X_i=a_0\}$ is accurate possibility that the value of the sample $X_i$ is $a_0$;

2) fitting a correlation function $R_0(d)$ that varies with the distance d into a function of the following form:

$$R_0(d) = \begin{cases} R_0(0), & d = 0 \\ R_0(1) \cdot \beta_{long}^{d-1}, & d > 0 \end{cases},$$

to obtain a long-term declining factor $\beta_{long}$ and a short-term declining factor $\beta_{short}$ of the correlation:

$\beta_{long}=R_0(d+1)/R_0(d), d>0$, $\beta_{short}=R_0(1)/R_0(0)$; and 3) calculating the smoothing rate according to one of the following methods:

$$\alpha = \frac{(R_0(0) - R_0(1)) \cdot \beta_{long} - \sqrt{(R_0(0) \cdot (1+\beta_{long}) - 2 \cdot R_0(1)) \cdot R_0(1) \cdot \beta_{long} \cdot (1-\beta_{long})}}{R_0(0) \cdot \beta_{long}^2 - R_0(1) \cdot \beta_{long}} \text{ or }$$

$$\alpha = \frac{(1-\beta_{short}) \cdot \beta_{long} - \sqrt{(1+\beta_{long} - 2 \cdot \beta_{short}) \cdot \beta_{long} \cdot (1-\beta_{long})}}{\beta_{long}^2 - \beta_{short} \cdot \beta_{long}}.$$

Further, the coding method further includes:

1) determining a model number of the sample to be coded according to context conditions of the sample to be coded, where a sample with the same model number as the sample to be coded is the same type of sample of the sample to be coded; and 2) the estimating the possibility distribution of value of the sample to be coded being to estimate the possibility distribution of value of the sample to be coded according to the accurate possibility distribution of value of at least one coded sample of the same type of the sample to be coded.

The second aspect of the invention provides an information preserving decoding method, including, for a sample to be decoded:

1) obtaining possibility distribution of value of the sample to be decoded; and 2) obtaining the value of the sample to be decoded by decoding a bitstream according to the possibility distribution of value of the sample to be decoded.

Further, the obtaining the possibility distribution of value of the sample to be decoded is: estimating the possibility distribution of value of the sample to be decoded according to the value of at least one decoded sample.

Further, the estimating the possibility distribution of value of the sample to be decoded is: estimating possibility $Po_{est}\{X_i=a_0\}$ that the value of a sample $X_i$ to be decoded is $a_0$ by using a non-linear prediction operator below and according to accurate possibility $Po_{acc}\{X_{i-d}=a_0\}$ that the value of a decoded sample $X_{i-d}$ with a distance d from the sample to be decoded is $a_0$:

$$Po_{est}\{X_i = a_0\} = \sum_{d=1}^{M} coeff_d \cdot Po_{acc}^d\{X_{i-d} = a_0\} + coeff_0 \cdot P_{init}(a_0),$$

where $P_{init}(a_0)$ is an initial estimated possibility that the value of the sample is $a_0$, $coeff_d$ and $coeff_0$ are weight coefficients, and d=1, 2, . . . M.

Further, the estimating the possibility distribution of value of the sample to be decoded is: estimating possibility $Po_{est}\{X_i=a_0\}$ that the value of a sample $X_i$ to be decoded is $a_0$ by using an exponential smoothing operator below and according to accurate possibility $Po_{acc}\{X_{i-1}=a_0\}$ that the value of a decoded sample $X_{i-1}$ is $a_0$ and estimated possibility $Po_{est}\{X_{i-1}=a_0\}$ that the value of the decoded sample is $a_0$:

$$Po_{est}\{X_i = a_0\} = \begin{cases} \alpha \cdot Po_{est}\{X_{i-1} = a_0\} + (1-\alpha) \cdot Po_{acc}\{X_{i-1} = a_0\} & \text{if } i > 1 \\ P_{init}(a_0) & \text{if } i = 1 \end{cases},$$

where $P_{init}(a_0)$ is an initial estimated possibility that the value of the sample is $a_0$, and $\alpha$ is the smoothing rate.

Further, the smoothing rate is obtained by the following method:

1) carrying out statistics on correlation $R_0(d)$ between neighboring samples with a distance d from each other in a decoded sample sequence:

$$R_0(d) = \frac{1}{N} \cdot \sum_{i=N}^{1} Po_{acc}\{X_i = a_0\} \cdot Po_{acc}\{X_{i-d} = a_0\},$$

where N is the length of the sample sequence, and $Po_{acc}\{X_i=a_0\}$ is accurate possibility that the value of the sample $X_i$ is $a_0$; and 2) fitting a correlation function $R_0(d)$ that varies with the distance d into a function of the following form:

$$R_0(d) = \begin{cases} R_0(0), & d = 0 \\ R_0(1) \cdot \beta_{long}^{d-1}, & d > 0 \end{cases},$$

to obtain a long-term declining factor $\beta_{long}$ and a short-term declining factor $\beta_{short}$ of the correlation:

$$\beta_{long}=R_0(d+1)/R_0(d), d>0$$

$$\beta_{short}=R_0(1)/R_0(0); \text{ and}$$

3) calculating the smoothing rate according to one of the following methods:

$$\alpha = \frac{(R_0(0) - R_0(1)) \cdot \beta_{long} - \sqrt{(R_0(0) \cdot (1 + \beta_{long}) - 2 \cdot R_0(1)) \cdot R_0(1) \cdot \beta_{long} \cdot (1 - \beta_{long})}}{R_0(0) \cdot \beta_{long}^2 - R_0(1) \cdot \beta_{long}}, \text{ or}$$

$$\alpha = \frac{(1 - \beta_{short}) \cdot \beta_{long} - \sqrt{(1 + \beta_{long} - 2 \cdot \beta_{short}) \cdot \beta_{long} \cdot (1 - \beta_{long})}}{\beta_{long}^2 - \beta_{short} \cdot \beta_{long}}.$$

Further, the decoding method further includes:

1) determining a model number of the sample to be decoded according to context conditions of the sample to be decoded, where a sample with the same model number as the sample to be decoded is the same type of sample of the sample to be decoded; and 2) the estimating the possibility distribution of value of the sample to be decoded being to estimate the possibility distribution of value of the sample to be decoded according to accurate possibility distribution of the value of at least one decoded sample of the same type of the sample to be decoded.

The third aspect of the invention provides an information preserving coding device, including the following two devices:

1) a device for obtaining a sample to be coded and possibility distribution of value of the sample to be coded; and 2) a device for generating a bitstream according to the possibility distribution of value of the sample to be coded and the value of the sample to be coded.

The fourth aspect of the invention provides an information persevering decoding device, including:

1) a device for obtaining possibility distribution of value of a sample to be decoded; and 2) a device for obtaining the value of the sample to be decoded by decoding a bitstream according to the possibility distribution of value of the sample to be decoded.

The invention also includes the following aspects: An information preserving coding method based on possibility distribution of value of a sample includes the following steps:

(1) obtaining a sample to be coded and possibility distribution of value thereof; and (2) generating a bitstream according to the possibility distribution of value of the sample to be coded and the value of the sample to be coded.

An information preserving decoding method based on possibility distribution of value of a sample includes the following steps:

(1) obtaining possibility distribution of value of a sample to be decoded; and (2) obtaining the value of the sample to be decoded by decoding a bitstream according to the possibility distribution of value of the sample to be decoded.

An information preserving coding method based on adaptive possibility estimation of value of a sample includes (1) carrying out statistics on correlation between the values of neighboring samples in a sample sequence;

(2) fitting a correlation function into a two-segment exponential declining function to obtain a long-term declining factor and a short-term declining factor of the correlation;

(3) calculating a smoothing rate of an exponential smoothing prediction operator according to the correlation between the values of the neighboring samples and the long-term declining factor and the short-term declining factor of the correlation; and (4) substituting the smoothing rate into the exponential smoothing prediction operator, estimating the possibility of value of the sample by using the operator, and performing information preserving coding by using the possibility of value of the sample.

An information preserving decoding method based on adaptive possibility estimation of value of a sample includes:

(1) obtaining a possibility prediction operator of a sample contained in a current bitstream to be decoded; and (2) estimating the possibility of value of the sample by using the possibility prediction operator obtained in (1) and decoding the bitstream by using the possibility of value of the sample to obtain the value of the sample.

An information preserving coding device based on possibility distribution of value of a sample includes the following devices:

(1) a device for obtaining a sample to be coded and possibility distribution of value thereof; and (2) a device for generating a bitstream according to the possibility distribution of value of the sample to be coded and the value of the sample to be coded.

An information preserving decoding device based on possibility distribution of value of a sample includes the following devices:

(1) a device for obtaining possibility distribution of value of a sample to be decoded; and (2) a device for obtaining the value of the sample to be decoded by decoding a bitstream according to the possibility distribution of value of the sample to be decoded.

An information preserving coding device based on adaptive possibility estimation of value of a sample includes the following devices:

(1) a device for carrying out statistics on correlation between the values of neighboring samples in a sample sequence;

(2) a device for fitting a correlation function into a two-segment exponential declining function to obtain a long-term declining factor and a short-term declining factor of the correlation;

(3) a device for calculating a smoothing rate of an exponential smoothing prediction operator according to the correlation between the values of the neighboring samples and the long-term declining factor and the short-term declining factor of the correlation; and (4) a device for substituting the derived smoothing rate into the exponential smoothing prediction operator, estimating the possibility of value of the sample by using the operator, and performing coding based on the possibility of the sample.

An information preserving decoding device based on adaptive possibility estimation of value of a sample includes the following devices:

(1) a device for obtaining a possibility prediction operator of a current sample sequence to be decoded; and (2) a device for estimating the possibility of value of the sample by using the possibility prediction operator obtained in (1) and performing decoding based on the possibility of the sample.

The coding method based on the possibility distribution of value of the sample provided by the invention solves the problem that the information preserving coding method based on the probability distribution of the source is not applicable to non-stationary source models. Coding is performed by using the possibility distribution of value of the sample, and the coding code length is the overhead caused by the prediction error of the possibility distribution of value of the sample. The multiple coding methods based on the possibility distribution of value of the sample provided by the invention can improve the prediction accuracy of the possibility distribution of value of the sample, and thereby greatly improving the coding efficiency.

DETAILED DESCRIPTION OF THE INVENTION

In order to make the objectives, technical solutions, and advantages of the embodiments of the invention clearer, the technical solutions in the embodiments of the invention will be described clearly and completely in conjunction with the accompanying drawings in the embodiments of the invention. Obviously, the embodiments described are a part of the embodiments of the invention, but not all the embodiments. Based on the embodiments of the invention, all other embodiments obtained by a person of ordinary skill in the art without creative work shall fall within the protection scope of the invention.

Embodiment 1

Figure 1:
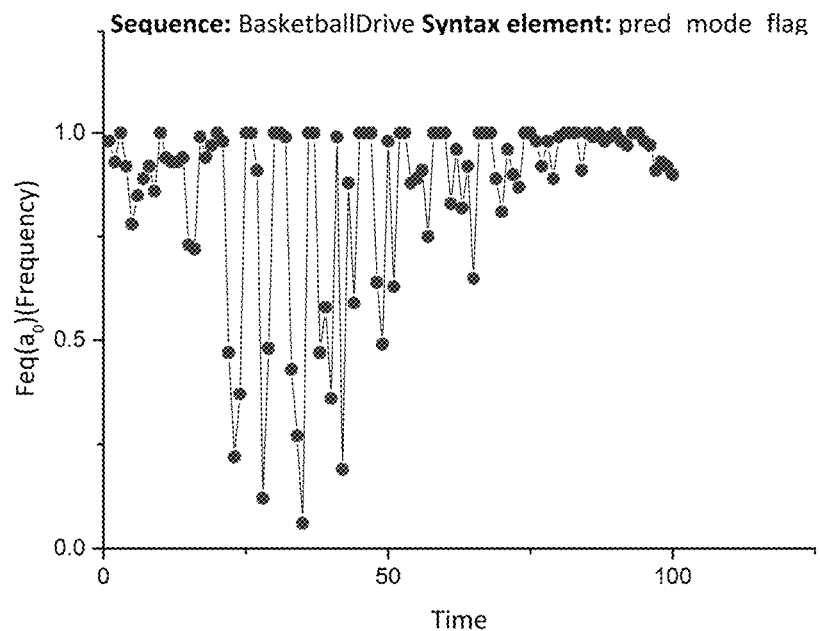
FIG. 1 shows a statistical graph of frequency changes over time.
Figure 2:
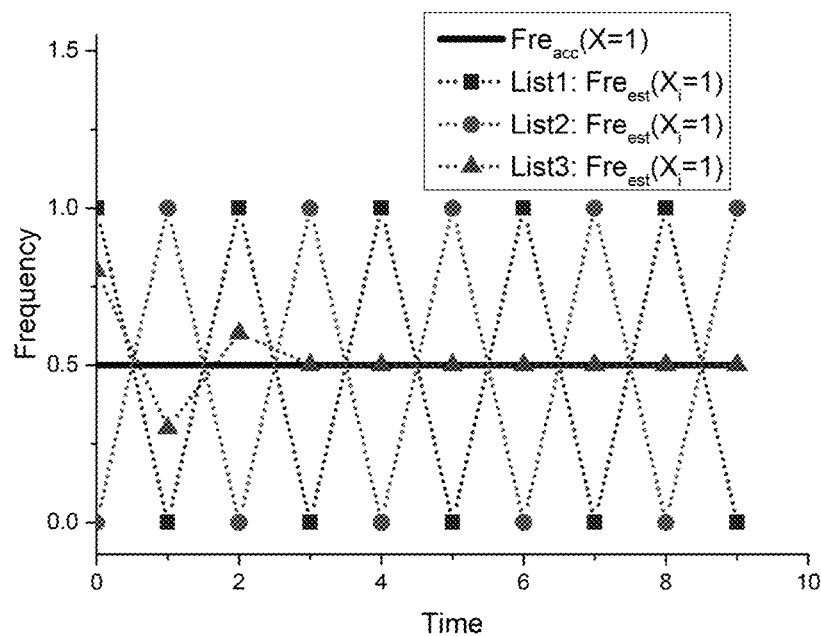
FIG. 2 shows accurate frequency distribution and estimated frequency distribution.
Figure 3:
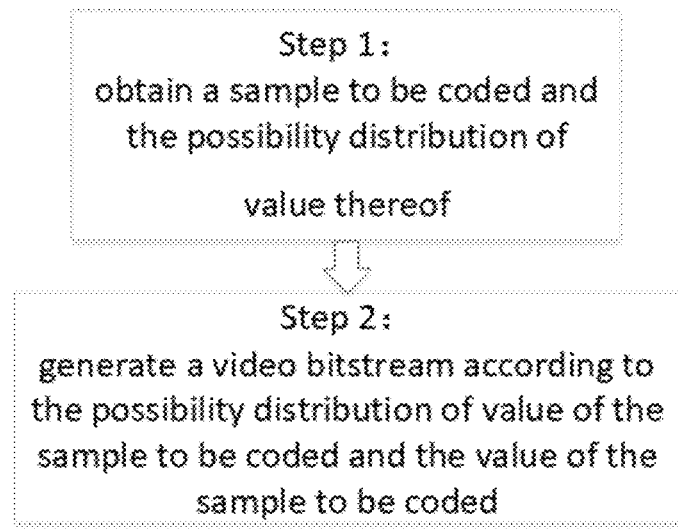
FIG. 3 shows a coding method based on possibility distribution of value of a sample.

FIG. 3 is an information preserving coding method based on possibility distribution of value of a sample provided by the embodiment of the invention, including the following steps:

Step 101: a sample to be coded and possibility distribution of value thereof are obtained.

More specifically, the possibility distribution of value of the sample refers to the evaluation of the possibility of various values of a sample. The possibility distribution includes accurate possibility distribution $Po_{acc}$ or estimated possibility distribution $Po_{est}$.

For a certain value of a specific sample, there are only two accurate possibilities: 0 or 1. For a specific sample $X_i$, assuming that its possible values are $a_0, a_1, a_2, \ldots, a_k$, where $a^i$ is the true value of the sample $X_i$, then for the sample $X_i$, the accurate possibility distribution of value thereof is:

$$\begin{cases} Po_{acc}\{X_i = a^i\} = 1 \\ Po_{acc}\{X_i \neq a^i\} = 0 \end{cases}.$$

In the actual situation, people often cannot know the accurate possibility distribution of value of the sample to be coded in advance, so the estimated possibility distribution is obtained by estimation.

Commonly used methods for estimating the possibility distribution include but are not limited to estimating possibility distribution of value of a current sample to be coded by using the value of a previously coded sample. A prediction operator may be linear or non-linear.

The form of linear operator is:

$$Po_{est}\{X_i = a_0\} = \sum_{d=1}^{M} coeff_d \cdot Po_{acc}\{X_{i-d} = a_0\} + coeff_0 \cdot P_{init}(a_0)$$

where $P_{init}(a_0)$ is an initial estimated possibility, $coeff_d$ ($d=1, 2, \ldots, M$) is a weight coefficient in the linear prediction operator, $X_i$ is the current sample to be coded, $X_{i-d}$ is the coded sample, and the most commonly used linear prediction operator is an exponential smoothing prediction (ESP) operator, as shown in the following formula:

$$Po_{est}\{X_i = a_0\} = \begin{cases} \alpha \cdot Po_{est}\{X_{i-1} = a_0\} + (1-\alpha) \cdot Po_{acc}\{X_{i-1} = a_0\} & \text{if } i > 1 \\ P_{init}(a_0) & \text{if } i = 1 \end{cases},$$

where the linear operator has various forms, including but not limited to:

$$Po_{est}\{X_i = a_0\} = \sum_{d=1}^{M} coeff_d \cdot Po_{acc}^d\{X_{i-d} = a_0\} + coeff_0 \cdot P_{init}(a_0),$$

where $P_{init}(a_0)$ is an initial estimated possibility, $coeff_d$ (d=1, 2, ..., M) is a weight coefficient in the linear prediction operator, $X_i$ is the current sample to be coded, and $X_{i-d}$ is the coded sample.

Step 102: a bitstream is generated according to the possibility distribution of value of the sample to be coded and the value of the sample to be coded.

More specifically, methods for generating the bitstream include but are not limited to:

(1) According to the possibility distribution of value of the sample, a different prefix code table is designed, and coding is performed according to the designed code table and the value of the current sample. More specifically, the code table may be designed according to a Huffman code word generation mode, a longer code word is designed for a value with less possibility, and a shorter code word is designed for a value with higher possibility.

| Value | Possibility (Estimated possibility) | Code table |
|---|---|---|
| 0 | 0.25 | 00 |
| 1 | 0.25 | 01 |
| 2 | 0.25 | 10 |
| 3 | 0.25 | 11 |

(2) Arithmetic coding is performed according to the possibility distribution of value of the sample, more specifically:

a. An initialization interval is (0, 1], i=1 is set, and the i-th sample is read in.

b. According to the possibility distribution of value of the i-th sample, the interval is divided, each value corresponds to one sub-interval, and a length of the sub-interval is proportional to the possibility of value.

c. According to the value of the i-th sample, an appropriate interval is selected.

d. If there is a next sample, the next sample is read in, i=i+1 is set, and the flow returns to step b; otherwise, the lower boundary of the interval is expanded according to binary decimals, and the first [−log$_2$(interval length)] digits are taken, and if there is a mantissa after it, the mantissa is carried to the [−log$_2$(interval length)]-th digit.

For a sample with estimated possibility distribution of $Po_{est}\{X_i=a_j\}$, if the arithmetic coding is used, the code length thereof with the value as is $\log_2(Po_{est}\{X_i=a_j\})$, then for the sample, the code length thereof is equal to $$\Sigma_{j=1}^{K} -\log_2(Po_{est}\{X_i=a_j\}) \ast Po_{acc}\{X_i=a_j\} = -\log_2(Po_{est}\{X_i=a^i\})),$$

where $a^i$ is the actual value of the current sample. For a sample sequence, the code rate is defined as:

$$CR = \frac{1}{N} \sum_{i=1}^{N} \sum_{j=1}^{K} -\log_2(Po_{est}\{X_i = a_j\}) \cdot Po_{acc}\{X_i = a_j\}$$

$$= \frac{1}{N} \sum_{i=1}^{N} -\log_2(Po_{est}\{X_i = a^i\}).$$

If we define $Po_{acc}\{X_i=a^i\} - Po_{est}\{X_i=a^i\}$ as the possibility distribution prediction error (PDPE) of the sample $X_i$, then the code rate can be converted to:

$$CR = \frac{1}{N} \sum_{i=1}^{N} -\log(1 - (1 - Po_{est}\{X_i = a^i\}))$$

$$= \frac{1}{N} \sum_{i=1}^{N} -\log(1 - (Po_{acc}\{X_i = a^i\} - Po_{est}\{X_i = a^i\}))$$

$$CR = APDPE = \frac{1}{N} \sum_{i=1}^{N} -\log(1 - PDPE_i).$$

It can be seen that when the possibility prediction is completely accurate, the code rate is 0. An actual code rate is the additional cost for the possibility distribution prediction error.

Compared with the coding method based on probability estimation, the coding method based on possibility estimation has the following advantages: 1, for a non-stationary source, we cannot accurately describe its probability distribution and therefore cannot determine a target of the probability estimation, while for one of sample sequences, we accurately describe the possibility distribution of each sample, therefore the possibility estimation has a clear target; and 2, for the non-stationary source, the coding performance is positively correlated with the accuracy of the possibility estimation, and we can improve the coding performance by improving the accuracy of the possibility estimation.

Embodiment 2

Figure 4:
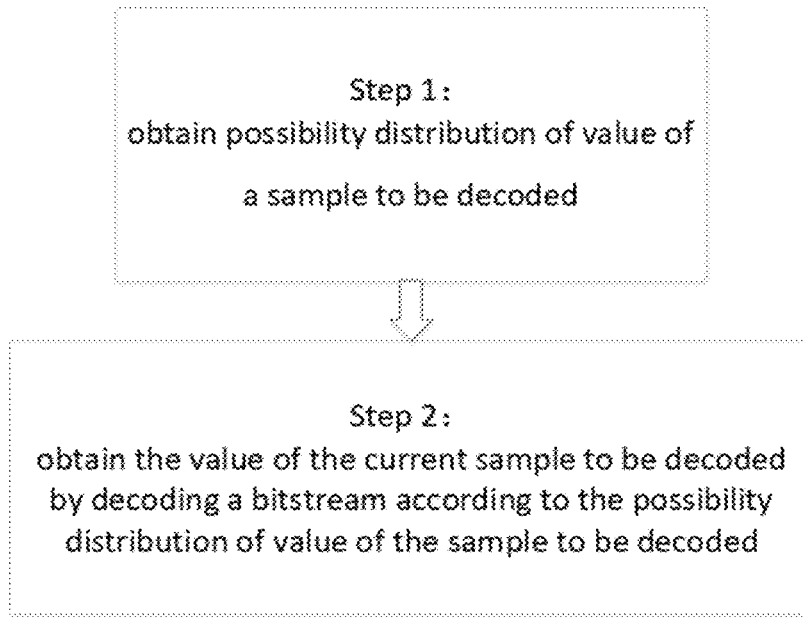
FIG. 4 shows a decoding method based on possibility distribution of value of a sample.

FIG. 4 is an information preserving decoding method based on the possibility distribution of value of a sample provided by the embodiment of the invention, including the following steps:

Step 201: the possibility distribution of value of a sample to be decoded is obtained.

More specifically, the possibility distribution of value of the sample refers to the evaluation of the possibility of various values of a sample. The possibility distribution includes accurate possibility distribution $Po_{acc}$ or estimated possibility distribution $Po_{est}$.

For a certain value of a specific sample, there are only two accurate possibilities: 0 or 1. For a specific sample $X_i$, assuming that its possible values are $a_0, a_1, a_2, \ldots, a_k$, where $a^i$ is the true value of the sample $X_i$, then for the sample $X_i$, the accurate possibility distribution of value thereof is:

$$\begin{cases} Po_{acc}\{X_i = a^i\} = 1 \\ Po_{acc}\{X_i \neq a^i\} = 0 \end{cases}.$$

In the actual situation, people often cannot know the accurate possibility distribution of value of the sample to be decoded in advance, so the estimated possibility distribution is obtained by estimation.

Commonly used methods for estimating the possibility distribution include but are not limited to estimating the possibility distribution of value of a current sample to be decoded by using the value of a previously decoded sample. A prediction operator may be linear or non-linear.

The form of linear operator is:

$$Po_{est}\{X_i = a_0\} = \sum_{d=1}^{M} coeff_d \cdot Po_{acc}\{X_{i-d} = a_0\} + coeff_0 \cdot P_{init}(a_0)$$

where $P_{init}(a_0)$ is an initial estimated possibility, $coeff_d$ (d=1, 2, . . . , M) is a weight coefficient in the linear prediction operator, $X_i$ is the current sample to be decoded, $X_{i-d}$ is the decoded sample, and the most commonly used linear prediction operator is an exponential smoothing prediction (ESP) operator, as shown in the following formula:

$$Po_{est}\{X_i = a_0\} = \begin{cases} \alpha \cdot Po_{est}\{X_{i-1} = a_0\} + (1-\alpha) \cdot Po_{acc}\{X_{i-1} = a_0\} & \text{if } i > 1 \\ P_{init}(a_0) & \text{if } i = 1 \end{cases}$$

where the linear operator has various forms, including but not limited to:

$$Po_{est}\{X_i = a_0\} = \sum_{d=1}^{M} coeff_d \cdot Po_{acc}^d\{X_{i-d} = a_0\} + coeff_0 \cdot P_{init}(a_0),$$

where $P_{init}(a_0)$ is an initial estimated possibility, $coeff_d$ (d=1, 2, . . . , M) is a weight coefficient in the linear prediction operator, $X_i$ is the current sample to be decoded, and $X_{i-d}$ is the decoded sample.

Step 202: the value of the current sample to be decoded is obtained by decoding a bitstream according to the possibility distribution of value of the sample to be decoded.

More specifically, methods for obtaining the value of the current sample to be decoded by decoding the bitstream include but are not limited to:

(1) According to the possibility distribution of value of a sample, a different prefix code table is designed, and decoding is performed according to the designed code table and the bitstream. More specifically, the code table may be designed according to a Huffman code word generation mode, a longer code word is designed for a value with less possibility, and a shorter code word is designed for a value with higher possibility. The decoding process is to compare a bit string in the bitstream with a bit string in the code table to obtain the value of the sample to be decoded.

| Value | Possibility (Estimated possibility) | Code table |
|---|---|---|
| 0 | 0.25 | 00 |
| 1 | 0.25 | 01 |
| 2 | 0.25 | 10 |
| 3 | 0.25 | 11 |

(2) Arithmetic decoding is performed according to the possibility distribution of value of the sample, more specifically, a. An initialization interval is (0, 1], and i=1 is set.

b. According to the possibility distribution of value of the i-th sample to be decoded, the interval is divided, each value corresponds to one sub-interval, and a length of the sub-interval is proportional to the possibility of value.

c. Which interval the value of the bitstream belongs to is determined, and the value of the i-th sample to be decoded is determined accordingly.

d. If there are still undecoded samples, i=i+1 is set, and the flow returns to step b; otherwise, the decoding process is ended.

Embodiment 3

Figure 5:
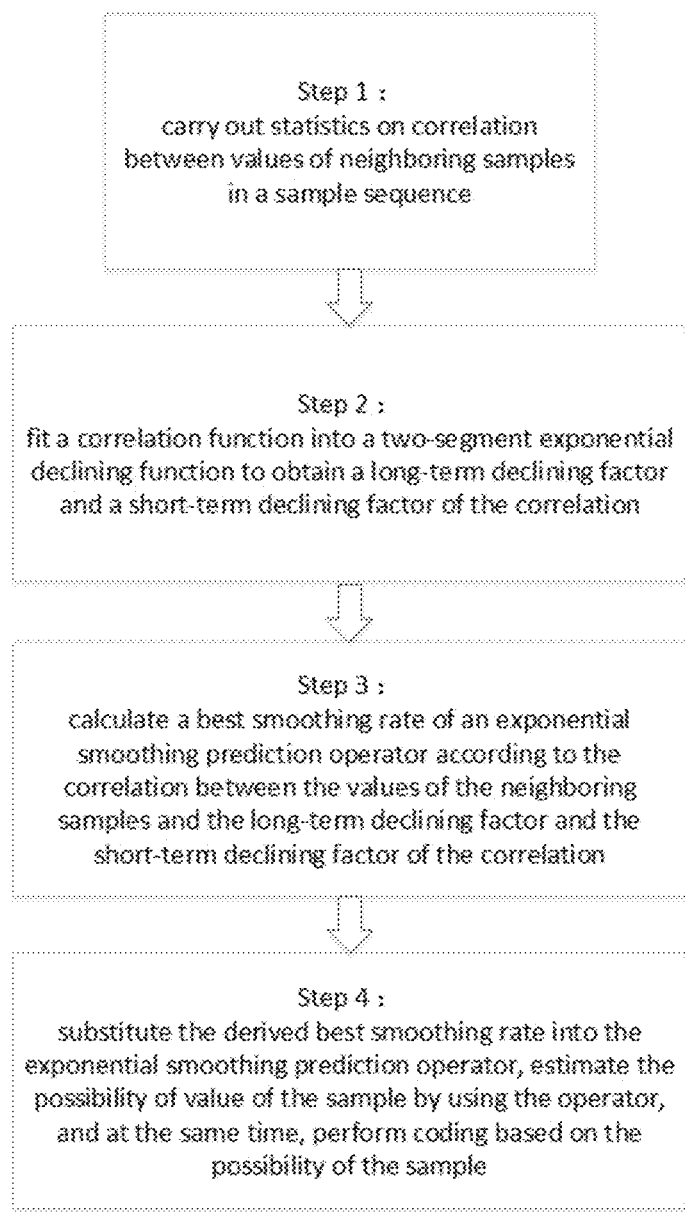
FIG. 5 shows a coding method based on adaptive possibility estimation of value of a sample.

FIG. 5 is a coding method based on adaptive possibility estimation of value of a sample provided by the embodiment of the invention. The method can design a suitable sample value possibility prediction operator for each sample sequence, perform adaptive possibility estimation of value of a sample by using the designed operator, and finally perform coding by using the estimated possibility of value of the sample. The designed prediction operator can greatly improve the accuracy of the possibility prediction of value of the sample, and thereby improving the coding efficiency. Specifically, the method includes the following steps:

Step 301: statistics is carried out on correlation $R_0(d)$ between the values of neighboring samples in the sample sequence. More specifically, the correlation $R_0(d)$ is obtained by the following formula:

$$R_0(d) = \frac{1}{N} \cdot \sum_{i=N}^{1} Po_{acc}\{X_i = a_0\} \cdot Po_{acc}\{X_{i-d} = a_0\},$$

where d is the distance between samples, N is the length of the sample sequence, and $Po_{acc}$ is the accurate possibility of value of the sample.

Step 302: a correlation function is fitted into a two-segment exponential declining function to obtain along-term declining factor $\beta_{long}$ and a short-term declining factor $\beta_{short}$ of the correlation.

More specifically, the two-segment exponential declining function is $$R_0(d) = \begin{cases} R_0(0), & d = 0 \\ R_0(1) \cdot \beta_{long}^{d-1}, & d > 0 \end{cases},$$

where $\beta_{long} = R_0(d+1)/R_0(d)$, d>0 is the long-term declining factor, which is used to describe the declining speed of long-distance correlation. We can also define the short-term declining factor $\beta_{short} = R_0(1)/R_0(0)$.

Step 303: the best smoothing rate of the exponential smoothing prediction operator is calculated according to the correlation $R_0(d)$ of the values of the neighboring samples and the long-term declining factor $\beta_{long}$ and the short-term declining factors $\beta_{short}$ of the correlation.

More specifically, the formula for calculating the best smoothing rate is as follows:

$$\alpha = \frac{(R_0(0) - R_0(1)) \cdot \beta_{long} - \sqrt{(R_0(0) \cdot (1 + \beta_{long}) - 2 \cdot R_0(1)) \cdot R_0(1) \cdot \beta_{long} \cdot (1 - \beta_{long})}}{R_0(0) \cdot \beta_{long}^2 - R_0(1) \cdot \beta_{long}}$$

$$= \frac{(1 - \beta_{short}) \cdot \beta_{long} - \sqrt{(1 + \beta_{long} - 2 \cdot \beta_{short}) \cdot \beta_{long} \cdot (1 - \beta_{long})}}{\beta_{long}^2 - \beta_{short} \cdot \beta_{long}}$$

Figure 6:
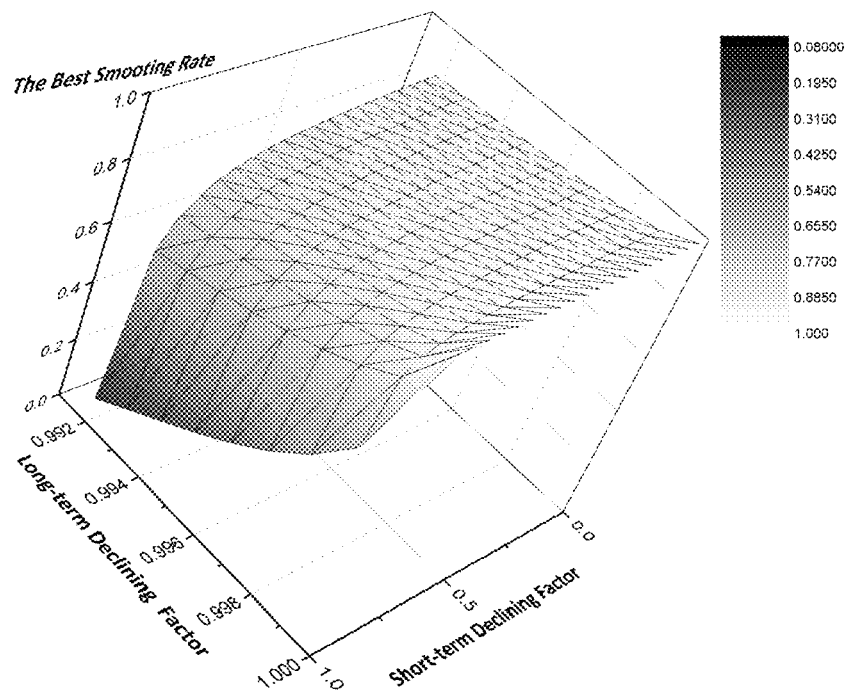
FIG. 6 shows a relation between the best smoothing rate and two declining factors.

The relation between the best smoothing rate and the two declining factors is shown in FIG. 6. The derivation process thereof is as follows:

(1) The code rate is the additional cost for the possibility distribution prediction error of the sample, as shown in the following formula:

$$CR = APDPE = \frac{1}{N}\sum_{i=1}^{N} -\log(1 - PDPE_i).$$

(2) The possibility distribution prediction error is associated with a possibility prediction model and the correlation between the neighboring samples. Since the possibility distribution prediction error is calculated in a logarithm domain, and the correlation is calculated in a real number domain, we use an approximate expression in the following formula to transfer the possibility distribution prediction error from the real number domain to the logarithm domain:

$-\log(1-PDPE_i) \approx 4 \cdot PDPE_i^2, (0 \leq PDPE_i < 1)$

Therefore, the code rate can be approximated as:

$$CR \approx \check{C}R = 4 \cdot \frac{1}{N}\sum_{i=1}^{N} PDPE_i^2.$$

(3) For a binary sequence, the possibility distribution prediction error has the following characteristics:

$$PDPE_i = Po_{acc}\{X_i = a_k^i\} - Po_{est}\{X_i = a_k^i\}$$

$$= |Po_{acc}\{X_i = a_0\} - Po_{est}\{X_i = a_0\}|.$$

Therefore, the code rate of the binary sample sequence is approximately:

$$\check{C}R = 4 \cdot \frac{1}{N}\sum_{i=1}^{N}(|Po_{acc}\{X_i = a_0\} - Po_{est}\{X_i = a_0\}|)^2.$$

(4) If the exponential smoothing method is used to perform possibility estimation, the prediction operator of the exponential smoothing method is:

$$Po_{est}\{X_i = a_0\} = (1 - \alpha) \cdot \left(\sum_{d=1}^{N} \alpha^{d-1} \cdot Y_{i-d}\right) + \alpha^{i-1} \cdot P_{init}(a_0),$$

where $\alpha$ is the smoothing rate, $P_{init}(a_0)$ is an initial estimated possibility, d is the distance between a current sample and a previous sample, and $Y_i$ is $Po_{acc}\{X_i = a_0\}$.

When the smoothing rate satisfies $0 \leq \alpha < 1$, after the possibility estimation is performed by using the exponential smoothing method, an approximate code rate can be expressed as $$\check{C}R_{ESP, 0 \leq \alpha < 1} = 4 \cdot E\left[\left(Y_i - (1-\alpha) \cdot \left(\sum_{d=1}^{N} \alpha^{d-1} \cdot Y_{i-d}\right) - \alpha^{i-1} \cdot P_{init}(a_0)\right)^2\right]$$

$$= 4 \cdot \left(\overbrace{E[Y_i^2]}^{item1} - \overbrace{2 \cdot E\left[Y_i \cdot (1-\alpha) \cdot \left[\sum_{d=1}^{N}\alpha^{d-1} \cdot Y_{i-d}\right]\right]}^{item2} + \overbrace{E\left[(1-\alpha)^2 \cdot \left(\sum_{d=1}^{N}\alpha^{d-1} \cdot Y_{i-d}\right)^2\right]}^{item3} - \right.$$

$$\left. \overbrace{2 \cdot E[Y_i \cdot \alpha^{i-1} \cdot P_{init}(a_0)]}^{item4} + \overbrace{2 \cdot E\left[(1-\alpha) \cdot \left(\sum_{d=1}^{N}\alpha^{d-1} \cdot Y_{i-d}\right) \cdot \alpha^{i-1} \cdot P_{init}(a_0)\right]}^{item5} + \overbrace{E[\alpha^{2i-2} \cdot P_{init}(a_0)^2]}^{item6}\right).$$

The first three items of the approximate code rate are related to the correlation $R_0(d)$, and the later three items are related to an initial value $P_{init}(a_0)$ of the prediction model. Assuming that the length of the sample sequence N is large enough, then the later three items are an infinitesimal. Neglecting the later three items and expressing the first three items by $R_0(d)$, the approximate code rate can be approximated as:

$$\tilde{CR}_{ESP,0\le\alpha<1} \approx 4 \cdot \left( R_0(0) - 2\cdot(1-\alpha)\cdot\left(\sum_{d=1}^{N}\alpha^{d-1}\cdot R_0(d)\right) + \right.$$
$$\left. (1-\alpha)^2 \cdot \sum_{d=1}^{N}\alpha^{2d-2}\cdot\left(R_0(0) + 2\cdot\sum_{t=1}^{N-d}\alpha^t\cdot R_0(t)\right)\right),$$

with the two-segment exponential declining function shown in step 302 being used to describe $R_0(d)$, it can get $$\tilde{CR}_{ESP,0\le\alpha<1} = 4 \cdot \left( R_0(0) - 2\cdot(1-\alpha)\cdot\frac{R_0(1)}{1-\alpha\cdot\beta_{long}} + \frac{1-\alpha}{1+\alpha}\cdot\left(R_0(0) + 2\cdot\frac{\alpha\cdot R_0(1)}{1-\alpha\cdot\beta_{long}}\right)\right)$$
$$= 8 \cdot \frac{(R_0(1) - R_0(0)\cdot\beta_{long})\cdot\alpha + R_0(0) - R_0(1)}{(1-\alpha\cdot\beta_{long})\cdot(1+\alpha)}.$$

The expression of the best smoothing rate can be obtained by getting the partial derivative of the approximate code rate in the above formula.

Step 304: the smoothing rate derived in step 303 is substituted into the exponential smoothing prediction operator, the possibility of value of the sample is estimated by using the operator, and at the same time, information preserving coding based on the possibility of value of the sample is performed.

Embodiment 4

Figure 7:
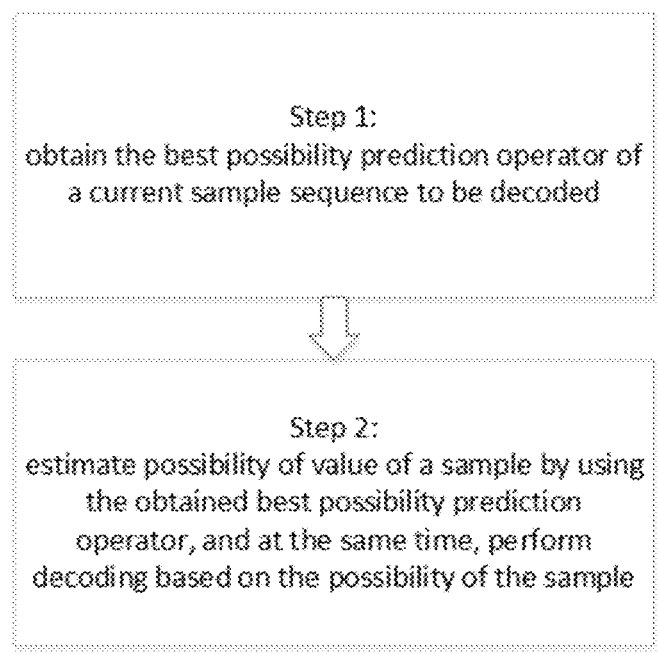
FIG. 7 shows a decoding method based on adaptive possibility estimation of value of a sample.

FIG. 7 is a decoding method based on adaptive possibility estimation of value of a sample provided by the embodiment of the invention. The method can perform decoding by using the best sample value possibility prediction operator. Specifically, the method includes the following steps:

Step 401: a possibility prediction operator of a current sample sequence to be decoded is obtained.

More specifically, parameters of the possibility prediction operator of the current sample sequence to be decoded may be transmitted to a decoder side through an encoder side, or may be derived by the decoder side by using decoded data.

If the parameters of the best possibility prediction operator of the current sample sequence to be decoded are transmitted to the decoder side through the encoder side, for example, the parameter of the exponential smoothing prediction operator is the smoothing rate, then encoder side gets the best smoothing rate of each sample sequence, and transmits the best smoothing rate of each sample sequence to the decoder side through a run-level coding mode, and the decoder side decodes the obtained best smoothing rate of each sample sequence. The best smoothing rate is substituted into the exponential smoothing prediction operator to obtain the best exponential smoothing-based possibility prediction operator.

If the parameters of the possibility prediction operator of the current sample sequence to be decoded are derived by using the decoded data, then, first, statistics is carried out on the correlation $R_0(d)$ between values of neighboring values of a decoded sample sequence:

$$R_0(d) = \frac{1}{N}\cdot\sum_{i=N}^{1} Po_{acc}\{X_i = a_0\}\cdot Po_{acc}\{X_{i-d} = a_0\}$$

where d is the distance between samples, N is the length of the decoded sample sequence, and $Po_{acc}$ is the accurate possibility of value of the sample.

Second, the correlation function is fitted into a two-segment exponential declining function to obtain along-term declining factor $\beta_{long}$ and a short-term declining factor $\beta_{short}$ of the correlation, more specifically, $$R_0(d) = \begin{cases} R_0(0), & d=0 \\ R_0(1)\cdot\beta_{long}^{d-1}, & d>0 \end{cases},$$

where $\beta_{long}=R_0(d+1)/R_0(d)$, d>0 is the long-term declining factor, which is used to describe the declining speed of long-distance correlation. We can also define the short-term declining factor $\beta_{short}=R_0(1)/R_0(0)$.

Next, the best smoothing rate of the exponential smoothing prediction operator is calculated according to the correlation $R_0(d)$ of value of the neighboring samples and the long-term declining factor $\beta_{long}$ and the short-term declining factor $\beta_{short}$ of the correlation.

More specifically, the formula for calculating the best smoothing rate is as follows:

$$\alpha = \frac{(R_0(0) - R_0(1))\cdot\beta_{long} - \sqrt{(R_0(0)\cdot(1+\beta_{long}) - 2\cdot R_0(1))\cdot R_0(1)\cdot\beta_{long}\cdot(1-\beta_{long})}}{R_0(0)\cdot\beta_{long}^2 - R_0(1)\cdot\beta_{long}}$$
$$= \frac{(1-\beta_{short})\cdot\beta_{long} - \sqrt{(1+\beta_{long} - 2\cdot\beta_{short})\cdot\beta_{long}\cdot(1-\beta_{long})}}{\beta_{long}^2 - \beta_{short}\cdot\beta_{long}}$$

the relation between the best smoothing rate and the two declining factors is shown in FIG. 6.

Finally, the derived best smoothing rate is substituted into the exponential smoothing prediction operator.

Step 402: decoding based on the sample possibility is performed by using the best exponential smoothing-based possibility prediction operator obtained in step 401 to estimate the possibility of value of the sample.

Embodiment 5

Figure 8:
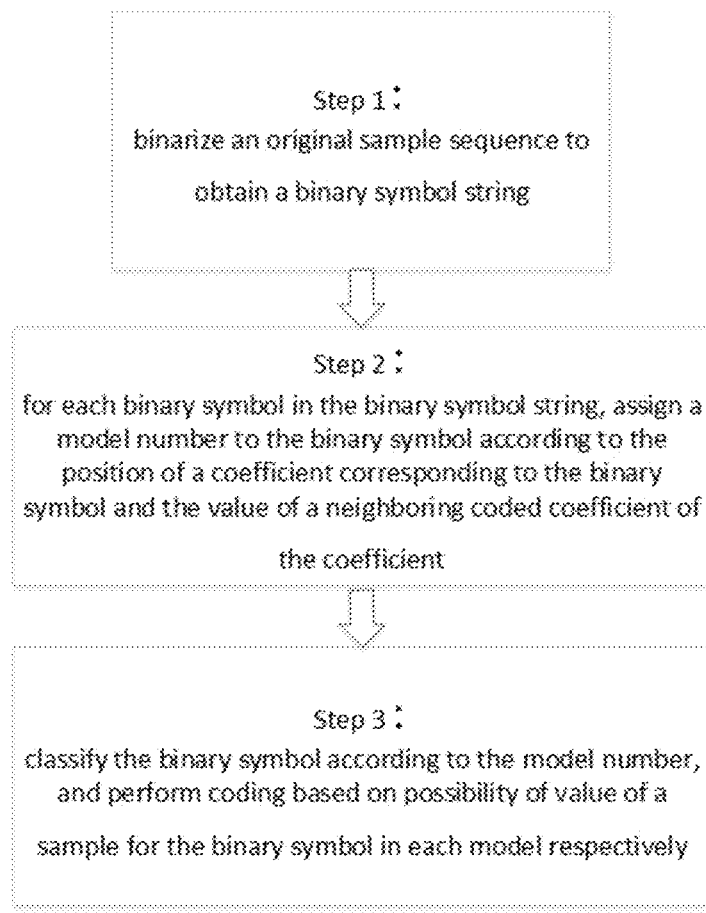
FIG. 8 shows a coding method for changing correction between neighboring symbols of a sample sequence.

FIG. 8 is an information preserving coding method for changing correlation between neighboring symbols of a sample sequence provided by the embodiment of the invention. The method can improve the accuracy of the possibility prediction of value of the sample by changing the correlation between the neighboring symbols of the sample sequence, and thereby improving the coding efficiency. Specifically, the method includes the following steps:

Step 501: a model number is assigned according to context conditions for each sample in a sample sequence.

Specifically, a binary symbol string obtained after binarization of a syntax element sig_coeff_flag is used as the sample sequence. The context conditions are (a) the position (x, y) of a coefficient corresponding to a sample in a coefficient block, and (b) the non-zero number in coded neighboring coefficients. The specific model assigning method is as follows:

(1) A region index regionIdx of a sample is obtained according to the position (x, y) of the coefficient corresponding to the sample in the coefficient block:

$$regionIdx = \begin{cases} 0 & x+y < 3 \\ 1 & 3 \leq x+y < 10, \text{ if } ((x \gg 2)+(y \gg 2) = 0) \\ 2 & 10 \leq x+y \end{cases}$$

$$regionIdx = \begin{cases} 3 & x+y < 4 \\ 4 & \text{else} \end{cases}, \text{ if } ((x \gg 2)+(y \gg 2) \neq 0).$$

Figure 9:
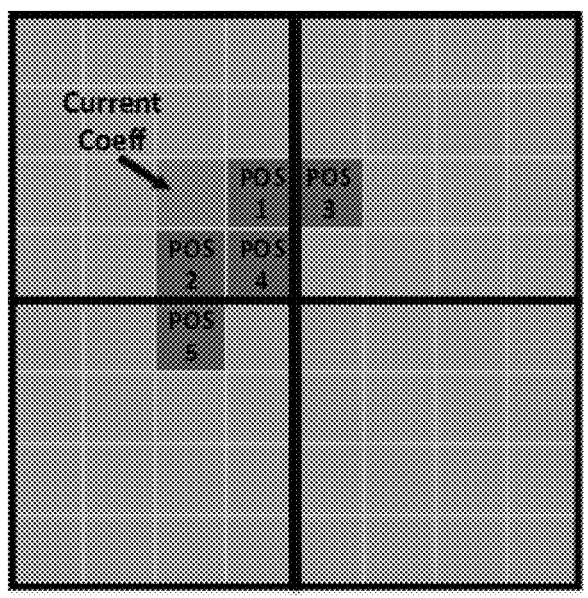
FIG. 9 shows location distribution of neighboring non-zero coefficients.

(2) Each region is divided into 6 sub-models according to the non-zero number of coded neighboring coefficients previous to the coefficient corresponding to the sample. Specifically, the positions of the neighboring non-zero coefficients are shown in FIG. 9, and the criterion for dividing sub-models in each region is:

ctxInc=min(2·$Pos_1$+2·$Pos_2$+$Pos_3$+$Pos_4$+$Pos_5$,5).

The neighboring non-zero coefficients are allocated with different weights according to their distances from the current coefficient.

(3) The sample is assigned to 30 models. The specific calculation method of the model number is:

ctxIdx=6·regionIdx+ctxInc.

Step 502: the sample is classified according to the model number described in step 501, and coding based on possibility of value of the sample is performed for the sample in each model.

Since an original sample sequence is divided into different new sample sub-sequences (different models) according to different context conditions, the order of the samples is changed. Therefore, the correlation between the neighboring samples is also changed.

Embodiment 6

Figure 10:
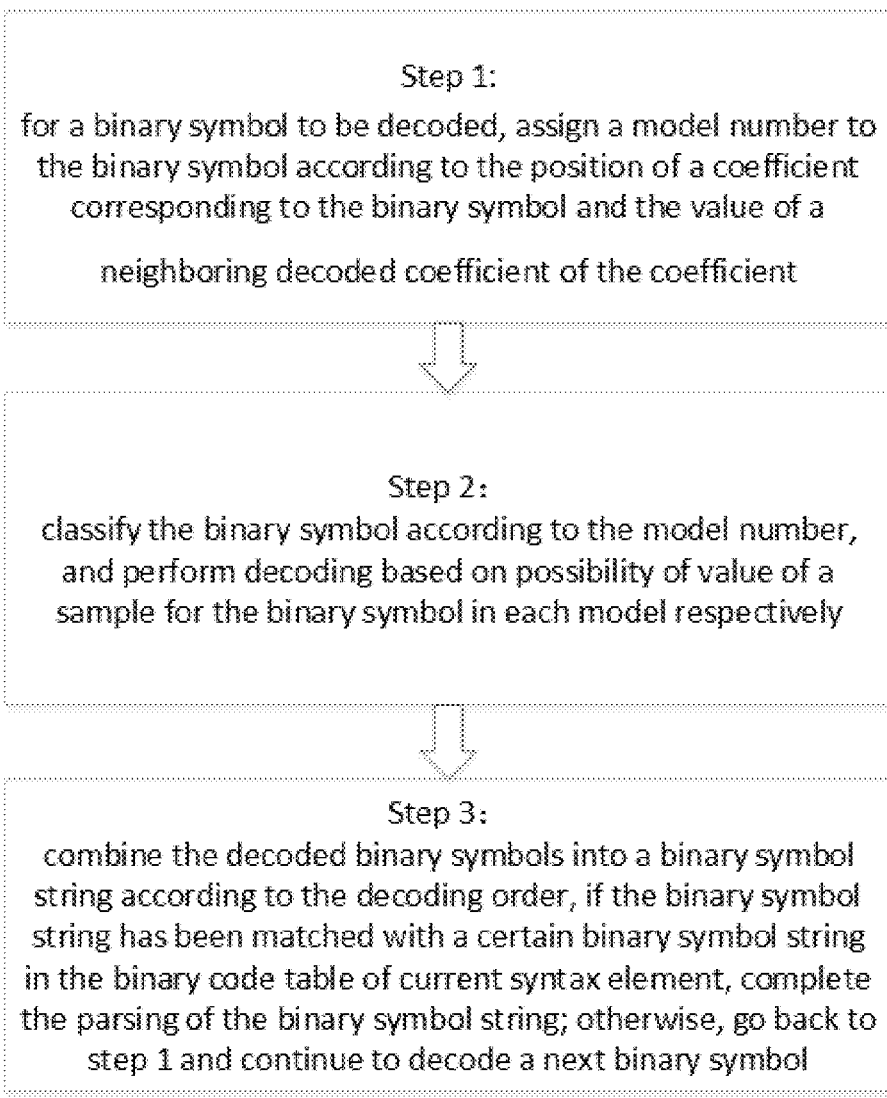
FIG. 10 shows a decoding method for changing correlation between neighboring symbols of a sample sequence.

FIG. 10 is an information preserving decoding method for changing correlation of neighboring symbols of a sample sequence provided by the embodiment of the invention. Specifically, the method includes the following steps:

Step 601: a model number is assigned according to context conditions for a sample to be decoded.

Specifically, a binary symbol string obtained after binarization of a syntax element sig_coeff_flag is used as the sample sequence. The context conditions are (a) the position (x, y) of a coefficient corresponding to a sample in a coefficient block, and (b) the non-zero number in decoded neighboring coefficients. The specific model assigning method is as follows.

(1) A region index regionIdx of a sample is obtained according to the position (x, y) of the coefficient corresponding to the sample in the coefficient block:

$$regionIdx = \begin{cases} 0 & x+y < 3 \\ 1 & 3 \leq x+y < 10, \text{ if } ((x \gg 2)+(y \gg 2) = 0) \\ 2 & 10 \leq x+y \end{cases}$$

$$regionIdx = \begin{cases} 3 & x+y < 4 \\ 4 & \text{else} \end{cases}, \text{ if } ((x \gg 2)+(y \gg 2) \neq 0).$$

(2) Each region is divided into 6 sub-models according to the non-zero number of decoded neighboring coefficients previous to the coefficient corresponding to the sample. Specifically, the positions of the neighboring non-zero coefficients are shown in FIG. 9, and the criterion for dividing sub-models in each region is:

ctxInc=min(2·$Pos_1$+2·$Pos_2$+$Pos_3$+$Pos_4$+$Pos_5$,5).

The neighboring non-zero coefficients are allocated with different weights according to their distances from the current coefficient.

(3) The sample is assigned to 30 models. The specific calculation method of the model number is:

ctxIdx=6·regionIdx+ctxInc.

Step 602: the sample is classified according to the model number described in step 601, and information preserving decoding based on possibility of value of the sample is performed for the sample in each model.

Embodiment 7

An information preserving coding device based on possibility distribution of value of a sample provided by the embodiment of the invention includes the following devices:

A device 701: a device for obtaining a sample to be coded and possibility distribution of value thereof.

More specifically, the possibility distribution of value of the sample refers to the evaluation of the possibility of various values of a sample. The possibility distribution includes accurate possibility distribution $Po_{acc}$ or estimated possibility distribution $Po_{est}$.

For a certain value of a specific sample, there are only two accurate possibilities: 0 or 1. For a specific sample $X_i$, assuming that its possible values are $a_0, a_1, a_2, \ldots, a_k$, where $a^i$ is the true value of the sample $X_i$, then for the sample $X_i$, the accurate possibility distribution of value thereof is:

$$\begin{cases} Po_{acc}\{X_i = a^i\} = 1 \\ Po_{acc}\{X_i \neq a^i\} = 0 \end{cases}.$$

In the actual situation, people often cannot know the accurate possibility distribution of value of the sample to be coded in advance, so the estimated possibility distribution is obtained by estimation.

Commonly used methods for estimating the possibility distribution include but are not limited to estimating possibility distribution of value of a current sample to be coded by using the value of at least one previously coded sample. A prediction operator may be linear or non-linear.

The form of linear operator is:

$$Po_{est}(X_i = a_0) = \sum_{d=1}^{M} coeff_d \cdot Po_{acc}\{X_{i-d} = a_0\} + coeff_0 \cdot P_{init}(a_0),$$

where $P_{init}(a_0)$ is an initial estimated possibility, $coeff_d$ (d=1, 2, . . . , M) is a weight coefficient in the linear prediction operator, $X_i$ is the current sample to be coded, $X_{i-d}$ is the coded sample, and the most commonly used linear prediction operator is an exponential smoothing prediction (ESP) operator, as shown in the following formula:

$$Po_{est}\{X_i = a_0\} = \begin{cases} \alpha \cdot Po_{est}\{X_{i-1} = a_0\} + (1-\alpha) \cdot Po_{acc}\{X_{i-1} = a_0\} & \text{if } i > 1 \\ P_{init}(a_0) & \text{if } i = 1 \end{cases},$$

where the linear operator has various forms, including but not limited to:

$$Po_{est}(X_i = a_0) = \sum_{d=1}^{M} coeff_d \cdot Po_{acc}^d\{X_{i-d} = a_0\} + coeff_0 \cdot P_{init}(a_0),$$

where $P_{init}(a_0)$ is an initial estimated possibility, $coeff_d$ (d=1, 2, . . . , M) is a weight coefficient in the linear prediction operator, $X_i$ is the current sample to be coded, and $X_{i-d}$ is the coded sample.

A device 702: a device for generating a bitstream according to the possibility distribution of value of the sample to be coded and the value of the sample to be coded.

More specifically, methods for generating the bitstream include but are not limited to:

(1) According to the possibility distribution of value of the sample, a different prefix code table is designed, and coding is performed according to the designed code table and the value of the current sample. More specifically, the code table may be designed according to a Huffman code word generation mode, a longer code word is designed for a value with less possibility, and a shorter code word is designed for a value with higher possibility.

| Value | Possibility (Estimated possibility) | Code table |
|---|---|---|
| 0 | 0.25 | 00 |
| 1 | 0.25 | 01 |
| 2 | 0.25 | 10 |
| 3 | 0.25 | 11 |

(2) Arithmetic coding is performed according to the possibility distribution of value of the sample, more specifically:

a. An initialization interval is (0, 1], i=1 is set, and the i-th sample is read in.

b. According to the possibility distribution of value of the i-th sample, the interval is divided, each value corresponds to one sub-interval, and a length of the sub-interval is proportional to the possibility of value.

c. According to the value of the i-th sample, an appropriate interval is selected.

d. If there is a next sample, the next sample is read in, i=i+1 is set, and the flow returns to step b; otherwise, the lower boundary of the interval is expanded according to binary decimals, and the first $[-\log_2(\text{interval length})]$ digits are taken, and if there is a mantissa after it, the mantissa is carried to the $[-\log_2(\text{interval length})]$-th digit.

Embodiment 8

An information preserving decoding device based on possibility distribution of value of a sample provided by the embodiment of the invention includes the following devices:

A device 801: a device for obtaining the possibility distribution of value of a sample to be decoded.

More specifically, the possibility distribution of value of the sample refers to the evaluation of the possibility of various values of a sample. The possibility distribution includes accurate possibility distribution $Po_{acc}$ or estimated possibility distribution $Po_{est}$.

For a certain value of a specific sample, there are only two accurate possibilities: 0 or 1. For a specific sample $X_i$, assuming that its possible values are $a_0, a_1, a_2, \ldots, a_k$, where $a^i$ is the true value of the sample $X_i$, then for the sample $X_i$, the accurate possibility distribution of value thereof is:

$$\begin{cases} Po_{acc}\{X_i = a^i\} = 1 \\ Po_{acc}\{X_i \neq a^i\} = 0 \end{cases}.$$

In the actual situation, people often cannot know the accurate possibility distribution of value of the sample to be decoded in advance, so the estimated possibility distribution is obtained by estimation.

Commonly used methods for estimating the possibility distribution include but are not limited to estimating the possibility distribution of value of a current sample to be decoded by using the value of a previously decoded sample. A prediction operator may be linear or non-linear.

The form of linear operator is:

$$Po_{est}(X_i = a_0) = \sum_{d=1}^{M} coeff_d \cdot Po_{acc}\{X_{i-d} = a_0\} + coeff_0 \cdot P_{init}(a_0),$$

where $P_{init}(a_0)$ is an initial estimated possibility, $coeff_d$ (d=1, 2, . . . , M) is a weight coefficient in the linear prediction operator, $X_i$ is the current sample to be decoded, $X_{i-d}$ is the decoded sample, and the most commonly used linear prediction operator is an exponential smoothing prediction (ESP) operator, as shown in the following formula:

$$Po_{est}\{X_i = a_0\} = \begin{cases} \alpha \cdot Po_{est}\{X_{i-1} = a_0\} + (1-\alpha) \cdot Po_{acc}\{X_{i-1} = a_0\} & \text{if } i > 1 \\ P_{init}(a_0) & \text{if } i = 1 \end{cases},$$

where the linear operator has various forms, including but not limited to:

$$Po_{est}(X_i = a_0) = \sum_{d=1}^{M} coeff_d \cdot Po_{acc}^d\{X_{i-d} = a_0\} + coeff_0 \cdot P_{init}(a_0),$$

where $P_{init}(a_0)$ is an initial estimated possibility, $coeff_d$ (d=1, 2, . . . , M) is a weight coefficient in the linear prediction operator, $X_i$ is the current sample to be decoded, and $X_{i\_d}$ is the decoded sample.

A device 802: a device for obtaining the value of the sample to be decoded by decoding a bitstream according to the possibility distribution of value of the sample to be decoded.

More specifically, methods for obtaining the value of the current sample to be decoded by decoding the bitstream include but are not limited to:

(1) According to the possibility distribution of value of a sample, a different prefix code table is designed, and decoding is performed according to the designed code table and the bitstream. More specifically, the code table may be designed according to a Huffman code word generation mode, a longer code word is designed for a value with less possibility, and a shorter code word is designed for a value with higher possibility. The decoding process is to compare a bit string in the bitstream with a bit string in the code table to obtain the value of the sample to be decoded.

| Value | Possibility (Estimated possibility) | Code table |
|---|---|---|
| 0 | 0.25 | 00 |
| 1 | 0.25 | 01 |
| 2 | 0.25 | 10 |
| 3 | 0.25 | 11 |

(2) Arithmetic decoding is performed according to the possibility distribution of value of the sample, more specifically, a. An initialization interval is (0, 1], and i=1 is set.

b. According to the possibility distribution of value of the i-th sample to be decoded, the interval is divided, each value corresponds to one sub-interval, and a length of the sub-interval is proportional to the possibility of value.

c. Which interval the value of the bitstream belongs to is determined, and the value of the i-th sample to be decoded is determined accordingly.

d. If there are still undecoded samples, i=i+1 is set, and the flow returns to step b; otherwise, the decoding process is ended.

Embodiment 9

An information preserving coding device based on adaptive possibility estimation of value of a sample provided by the embodiment of the invention, specifically, includes the following devices.

A device 901: a device for carrying out statistics on the correlation $R_0(d)$ of value of neighboring samples in a sample sequence. More specifically, the correlation $R_0(d)$ is obtained by the following formula:

$$R_0(d) = \frac{1}{N} \cdot \sum_{i=N}^{1} Po_{acc}\{X_i = a_0\} \cdot Po_{acc}\{X_{i-d} = a_0\},$$

where d is the distance between samples, N is the length of the sample sequence, and $Po_{acc}$ is the accurate possibility of value of the sample.

A device 902: a device for fitting the correlation function into a two-segment exponential declining function to obtain a long-term declining factor $\beta_{long}$ and a short-term declining factor $\beta_{short}$ of the correlation. More specifically, $$R_0(d) = \begin{cases} R_0(0), & d = 0 \\ R_0(1) \cdot \beta_{long}^{d-1}, & d > 0 \end{cases},$$

where $\beta_{long} = R_0(d+1)/R_0(d)$, d>0 is the long-term declining factor, which is used to describe the declining speed of long-distance correlation. We can also define the short-term declining factor $\beta_{short} = R_0(1)/R_0(0)$.

A device 903: a device for calculating the smoothing rate of the exponential smoothing prediction operator according to the correlation $R_0(d)$ of the values of the neighboring samples and a long-term declining factor $\beta_{long}$ and a short-term declining factor $\beta_{short}$ of the correlation.

More specifically, the calculation formula of the smoothing rate is as follows:

$$\alpha = \frac{(R_0(0) - R_0(1)) \cdot \beta_{long} - \sqrt{(R_0(0) \cdot (1 + \beta_{long}) - 2 \cdot R_0(1)) \cdot R_0(1) \cdot \beta_{long} \cdot (1 - \beta_{long})}}{R_0(0) \cdot \beta_{long}^2 - R_0(1) \cdot \beta_{long}}$$

$$= \frac{(1 - \beta_{short}) \cdot \beta_{long} - \sqrt{(1 + \beta_{long} - 2 \cdot \beta_{short}) \cdot \beta_{long} \cdot (1 - \beta_{long})}}{\beta_{long}^2 - \beta_{short} \cdot \beta_{long}}.$$

The relation between the smoothing rate and the two declining factors is shown in FIG. 6.

A device 904: a device for substituting the smoothing rate derived by the device 903 into the exponential smoothing prediction operator, estimating the possibility of value of the sample by using the operator, and at the same time, performing coding based on the sample possibility.

Embodiment 10

A decoding device based on adaptive possibility estimation of value of a sample provided by the embodiment of the invention, specifically, includes the following devices:

A device 1001: a device for obtaining a possibility prediction operator of a sample sequence to be decoded.

More specifically, parameters of the best possibility prediction operator of the current sample to be decoded may be transmitted to a decoder side through an encoder side, or may be derived by the decoder side by using decoded data.

If the parameters of the best possibility prediction operator of the current sample sequence to be decoded are transmitted to the decoder side through the encoder side, for example, the parameter of the exponential smoothing prediction operator is the smoothing rate, then the encoder side obtains the best smoothing rate of each sample sequence, and transmits the best smoothing rate of each sample sequence to the decoder side through a run-level coding mode, and the decoder side decodes the obtained best smoothing rate of each sample sequence. The best smoothing rate is substituted into the exponential smoothing prediction operator to obtain the best possibility prediction operator.

If the parameters of the best possibility prediction operator of the current sample sequence to be decoded are derived by using the decoded data, then, first, statistics is carried out on the correlation $R_0(d)$ between values of neighboring values of a decoded sample sequence:

$$R_0(d) = \frac{1}{N} \cdot \sum_{i=N}^{1} Po_{acc}\{X_i = a_0\} \cdot Po_{acc}\{X_{i-d} = a_0\}$$

where d is the distance between samples, N is the length of the decoded sample sequence, and $Po_{acc}$ is the accurate possibility of value of the sample.

Second, the correlation function is fitted into a two-segment exponential declining function to obtain along-term declining factor $\beta_{long}$ and a short-term declining factor $\beta_{short}$ of the correlation, more specifically, $$R_0(d) = \begin{cases} R_0(0), & d = 0 \\ R_0(1) \cdot \beta_{long}^{d-1}, & d > 0 \end{cases},$$

where $\beta_{long} = R_0(d+1)/R_0(d)$, d>0 is the long-term declining factor, which is used to describe the declining speed of long-distance correlation. We can also define the short-term declining factor $\beta_{short} = R_0(1)/R_0(0)$.

Next, the best smoothing rate of the exponential smoothing prediction operator is calculated according to the correlation $R_0(d)$ of value of the neighboring samples and the long-term declining factor $\beta_{long}$ and the short-term declining factor $\beta_{short}$ of the correlation.

More specifically, the formula for calculating the best smoothing rate is as follows:

$$\alpha = \frac{(R_0(0) - R_0(1)) \cdot \beta_{long} - \sqrt{(R_0(0) \cdot (1 + \beta_{long}) - 2 \cdot R_0(1)) \cdot R_0(1) \cdot \beta_{long} \cdot (1 - \beta_{long})}}{R_0(0) \cdot \beta_{long}^2 - R_0(1) \cdot \beta_{long}}$$

$$= \frac{(1 - \beta_{short}) \cdot \beta_{long} - \sqrt{\frac{(1 + \beta_{long} - 2 \cdot \beta_{short}) \cdot}{\beta_{long} \cdot (1 - \beta_{long})}}}{\beta_{long}^2 - \beta_{short} \cdot \beta_{long}},$$

the relation between the best smoothing rate and the two declining factors is shown in FIG. 6.

Finally, the derived smoothing rate is substituted into the exponential smoothing prediction operator.

A device 1002: a device for decoding based on the possibility of the sample by estimating the possibility of value of the sample with the possibility prediction operator obtained by the device 1001.

Embodiment 11

An information preserving coding device for changing correlation of neighboring symbols of a sample sequence provided by the embodiment of the invention, specifically, includes the following:

A device 1001: a device for assigning a model number according to context conditions for each sample in a sample sequence.

Specifically, a binary symbol string obtained after binarization of a syntax element sig_coeff_flag is used as the sample sequence. The context conditions are (a) the position (x, y) of a coefficient corresponding to a sample in a coefficient block, and (b) the non-zero number in coded neighboring coefficients. The specific model assigning method is as follows:

(1) A region index regionIdx of a sample is obtained according to the position (x, y) of the coefficient corresponding to the sample in the coefficient block:

$$regionIdx = \begin{cases} 0 & x + y < 3 \\ 1 & 3 \leq x + y < 10, \text{ if } ((x >> 2) + (y >> 2) = 0) \\ 2 & 10 \leq x + y \end{cases}$$

$$regionIdx = \begin{cases} 3 & x + y < 4 \\ 4 & \text{else} \end{cases}, \text{ if } ((x >> 2) + (y >> 2) \neq 0).$$

(2) Each region is divided into 6 sub-models according to the non-zero number of coded neighboring coefficients previous to the coefficient corresponding to the sample. Specifically, the positions of the neighboring non-zero coefficients are shown in FIG. 9, and the criterion for dividing sub-models in each region is:

ctxInc=min(2·$Pos_1$+2·$Pos_2$+$Pos_3$+$Pos_4$+$Pos_5$,5).

The neighboring non-zero coefficients are allocated with different weights according to their distances from the current coefficient.

(3) The sample is assigned to 30 models. The specific calculation method of the model number is:

ctxIdx=6·regionIdx+ctxInc

A device 1102: a device for classifying the sample according to the model number described in the device 1101, and performing coding based on possibility of value of the sample for the sample in each model.

Since an original sample sequence is divided into different new sample sub-sequences (different models) according to different context conditions, the order of the samples is changed. Therefore, the correlation between the neighboring samples is also changed.

Embodiment 12

An information preserving decoding device for changing correlation of neighboring symbols of a sample sequence provided by the embodiment of the invention, specifically, includes the following devices:

A device 1201: a device for assigning a model number according to context conditions for a sample to be decoded.

Specifically, a binary symbol string obtained after binarization of a syntax element sig_coeff_flag is used as the sample sequence. The context conditions are (a) the position (x, y) of a coefficient corresponding to a sample in a coefficient block, and (b) the non-zero number in decoded neighboring coefficients. The specific model assigning method is as follows.

(1) A region index regionIdx of a sample is obtained according to the position (x, y) of the coefficient corresponding to the sample in the coefficient block:

$$regionIdx = \begin{cases} 0 & x + y < 3 \\ 1 & 3 \leq x + y < 10, \text{ if } ((x >> 2) + (y >> 2) = 0) \\ 2 & 10 \leq x + y \end{cases}$$

$$regionIdx = \begin{cases} 3 & x + y < 4 \\ 4 & \text{else} \end{cases}, \text{ if } ((x >> 2) + (y >> 2) \neq 0).$$

(2) Each region is divided into 6 sub-models according to the non-zero number of decoded neighboring coefficients previous to the coefficient corresponding to the sample. Specifically, the positions of the neighboring non-zero coefficients are shown in FIG. 9, and the criterion for dividing sub-models in each region is:

ctxInc=min(2·Pos$_1$+2·Pos$_2$+Pos$_3$+Pos$_4$+Pos$_5$,5)

The neighboring non-zero coefficients are allocated with different weights according to their distances from the current coefficient.

(3) The sample is assigned to 30 models. The specific calculation method of the model number is:

ctxIdx=6·regionIdx+ctxInc

A device 1202: a device for classifying the sample according to the model number described in the device 1201, and performing information preserving decoding based on the possibility of value of the sample for the sample in each model.

Embodiment 13

The embodiment of the invention provides a design method for assigning a model according to context conditions, including the following steps:

Step 1301: a sample sequence $X_1, X_2 \ldots X_N$ of a binary source to be coded is obtained, where $X_i$ is the i-th symbol in the sample sequence, and the alphabet of the binary sample sequence is A={a0, a1}.

Specifically, the sample sequence to be coded may be a sequence consisting of a same binary syntax element, or may be a sequence consisting of a binary symbol string after binarization of the syntax element.

Step 1302: more than one method for assigning a model based on context conditions are enumerated, where each method divides the binary sample sequence described in step 1301 into at least one sample sub-sequence.

Specifically, it may be assumed that C methods for assigning a model based on context conditions are designed. For the c-th (c=1, 2, 3, . . . , C) modeling method, N samples are put into $S^c$ models in sequence according to context conditions, and the $S^c$ models are used to code respectively. Each model has $N_s^c$(s=1, 2, . . . , $S^c$) samples, respectively are $X_1^s, X_2^s \ldots X_{Ncs}^s$.

Step 1303: the correlation optimization rate of the sample sequence is calculated under each method for assigning a model according to context conditions in step 1302.

Specifically, first, the correlation R(d, $a_0$) of an original sample sequence is calculated by the following formula:

$$R(d, a_0) = \frac{1}{N} \cdot \sum_{i=N}^{1} ((X_i == a_0) \cdot (X_{i-d} == a_0)),$$

when i<0, $X_i$=0, d is the distance of the correlation, and generally, d=1.

Further, the symbol correlation $R_s^c(d, a_0)$ of each sample sub-sequence is calculated by the following formula:

$$R_s^c(d, a_0) = \frac{1}{N_s^c} \cdot \sum_{N_s^c}^{d+1} ((X_i^s == a_0) \cdot (X_{i-d}^s == a_0)).$$

Next, the average correlation $aveR^c$ of the sample sub-sequence under the c-th method of assigning a model based on context conditions is calculated by the following formula:

$$aveR^c = \left(\sum_{s=1}^{S^c} R_s^c(d, a_0) \cdot N_s^c\right) \bigg/ N.$$

Finally, the correlation optimization rate $COR^c$ of the c-th context modeling method is calculated by the following formula:

$$COR^c = aveR^c / R^c(d, a_0)$$

Step 1304: the modeling method with the highest sample sequence correlation optimization rate is selected as the best context modeling method.

Embodiment 14

The invention provides a design method for assigning a model based on context conditions, including the following steps:

Step 1401: a sample sequence $X_1, X_2 \ldots X_N$ of a binary source to be coded is obtained, where $X_i$ is the i-th symbol in the sample sequence, and the alphabet of the binary sample sequence is A={$a_0, a_1$}.

Specifically, a binary syntax element sig_coeff_flag generated by the HEVC standard during coding is obtained as a binary sample.

Step 1402: more than one method for assigning a model based on context conditions are enumerated, where each method divides the binary sample sequence described in step 1401 into at least one sample sub-sequence.

More specifically, for the sample sequence of sig_coeff_flag, there are a total of 5 context modeling conditions:

1, the size of a coefficient block; 2, the position of a coefficient corresponding to a binary symbol in the coefficient block; 3, the amplitude of value of the neighboring same syntax elements; 4, the coefficient scan order; and 5, color component.

8 modeling methods based on context conditions are enumerated with the combinations of the above modeling conditions, and the following conditions are respectively used:

Modeling method 1: no additional conditions are used, and all signals use a same model Modeling method 2: 1+2+3+4+5

Modeling method 3: 2+3+4+5(without 1)

Modeling method 4: 1+3+4+5(without 2)

Modeling method 5: 1+2+4+5(without 3)

Modeling method 6: 1+2+3+5(without 4)

Modeling method 7: 1+2+3+4(without 5)

Modeling method 8: 2+3

Step 1403: the correlation optimization rate of the sample sequence is calculated under each method for assigning a model according to context conditions in step 1402.

Statistics is carried out on the sample sequence correlation optimization rates COR of the sample sequence of sig_coeff_flag in the three test sequences of BasketballDrive, SlideEditing and BQMall under different modeling conditions.

| Modeling condition | Number of models | COR BasketballDrive | SlideEditing | BQMall |
|---|---|---|---|---|
| None | 1 | 1 | 1 | 1 |
| 1 + 2 + 3 + 4 + 5 | 42 | 1.141 | 0.999 | 1.035 |
| 2 + 3 + 4 + 5 (without 1) | 17 | 1.136 | 0.985 | 1.021 |
| 1 + 3 + 4 + 5 (without 2) | 14 | 1.006 | 0.977 | 1.003 |
| 1 + 2 + 4 + 5 (without 3) | 42 | 1.017 | 0.990 | 1.016 |
| 1 + 2 + 3 + 5 (without 4) | 36 | 1.142 | 0.999 | 1.035 |
| 1 + 2 + 3 + 4 (without 5) | 27 | 1.138 | 0.994 | 1.034 |
| Proposed (2 + 3) | 30 | 1.159 | 1.158 | 1.064 |

Step 1404: the modeling method with the highest sample sequence optimization rate is selected as the best context modeling method.

Specifically, the conditions 1, 4, and 5 have relatively little impact on COR, and even have side effects. Only conditions 2 and 3 can achieve the highest optimization rate COR. Therefore, the condition 2 (the position of the coefficient corresponding to the binary symbol in the coefficient block) and the condition 3 (the amplitude of the value of the neighboring same syntax elements) are selected as the modeling conditions. The conditions 1, 4, and 5 are not used as the modeling conditions for coefficient syntax elements.

The invention claimed is:

1. An information preserving coding method, comprising, for a sample to be coded:
   1) obtaining the sample to be coded;
   2) estimating possibility Poest{Xi=a0} of the value a0 of the sample to be coded Xi by a prediction operator using accurate possibility Poacc{Xi−d=a0} of at least one coded sample Xi−d with the same value a0, where the accurate possibility has the value of either 0 or 1, and d is a distance from the coded sample Xi−d to the sample to be coded; and
   3) generating a bitstream according to the possibility of the value of the sample to be coded Poest{Xi=a0} and the value of the sample to be coded a0.

2. The information preserving coding method according to claim 1, wherein the estimating possibility $Po_{est}\{X_i=a_0\}$ of the value $a_0$ of the sample to be coded $X_i$ by a prediction operator using accurate possibility $Po_{acc}\{X_{i-d}=a_0\}$ of at least one coded sample $X_{i-d}$ with the same value $a_0$ is:

$$Po_{est}\{X_i = a_0\} = \sum_{d=1}^{M} coeff_d \cdot Po_{acc}^d\{X_{i-d} = a_0\} + coeff_0 \cdot P_{init}(a_0),$$

wherein $P_{init}(a_0)$ is an initial estimated possibility that value of sample is $a_0$, and $coeff_d$ and $coeff_0$ are weight coefficients, and d=1, 2, ... M.

3. The information preserving coding method according to claim 1, wherein the estimating possibility $Po_{est}\{X_i=a_0\}$ of the value $a_0$ of the sample to be coded $X_i$ by a prediction operator using accurate possibility $Po_{acc}\{X_{i-d}=a_0\}$ of at least one coded sample $X_{i-d}$ with the same value $a_0$ is: estimating the possibility $Po_{est}\{X_{i-d}=a_0\}$ by using an exponential smoothing prediction operator below with d=1:

$$Po_{est}\{X_i = a_0\} = \begin{cases} \alpha \cdot Po_{est}\{X_{i-1} = a_0\} + (1-\alpha) \cdot Po_{acc}\{X_{i-1} = a_0\} & \text{if } i > 1 \\ P_{init}(a_0) & \text{if } i = 1 \end{cases},$$

where $P_{init}(a_0)$ is an initial estimated possibility that the value of the sample is $a_0$, and $\alpha$ is the smoothing rate.

4. The information preserving coding method according to claim 3, wherein the smoothing rate is obtained by the following method:
   1) carrying out statistics on correlation $R_0(d)$ between neighboring samples with a distance d from each other in a coded sample sequence:

$$R_0(d) = \frac{1}{N} \cdot \sum_{i-N}^{1} Po_{acc}\{X_i = a_0\} \cdot Po_{acc}\{X_{i-d} = a_0\},$$

wherein N is the length of the sample sequence, and $Po_{acc}\{X_i=a_0\}$ is accurate possibility that the value of the sample $X_i$ is $a_0$;
   2) fitting a correlation function $R_0(d)$ that varies with the distance d into a function of the following form:

$$R_0(d) = \begin{cases} R_0(0), & d = 0 \\ R_0(1) \cdot \beta_{long}^{d-1}, & d > 0 \end{cases}$$

to obtain a long-term declining factor $\beta_{long}$ and a short-term declining factor $\beta_{short}$ of the correlation:

$\beta_{long}=R_0(d+1)/R_0(d), d>0,$ $\beta_{short}=R_0(1)/R_0(0);$ and 3) calculating the smoothing rate according to one of the following methods:

$$\alpha = \frac{(R_0(0)-R_0(1))\cdot\beta_{long} - \sqrt{(R_0(0)\cdot(1+\beta_{long})-2\cdot R_0(1))\cdot R_0(1)\cdot\beta_{long}\cdot(1-\beta_{long})}}{R_0(0)\cdot\beta_{long}^2 - R_0(1)\beta_{long}},$$

$$\text{or } \alpha = \frac{(1-\beta_{short})\cdot\beta_{long} - \sqrt{(1+\beta_{long}-2\cdot\beta_{short})\cdot\beta_{long}\cdot(1-\beta_{long})}}{\beta_{long}^2 - \beta_{short}\cdot\beta_{long}}.$$

5. The information preserving coding method according to claim 1, further comprising:
   1) determining a model number of the sample to be coded according to context conditions of the sample to be coded, wherein a sample with the same model number as the sample to be coded is the same type of sample of the sample to be coded; and
   2) the said coded sample having the same type as the sample to be coded.

6. An information preserving decoding method, comprising, for a sample to be decoded:
   1) estimating possibility Poest{Xi=a0} of the value a0 of the sample to be coded Xi by a prediction operator using accurate possibility Poacc{Xi-d=a0} of at least one coded sample Xi-d with the same value a0, where the accurate possibility has the value of either 0 or 1, and d is a distance from the coded sample Xi-d to the sample to be coded; and
   2) obtaining the value of the sample to be decoded by decoding a bitstream according to the possibility of the of the sample to be decoded $a_0$.

7. The information preserving decoding method according to claim 6, wherein the obtaining the possibility of the value of the sample to be decoded is: estimating the possibility of the value of the sample to be decoded according to the value of at least a decoded sample.

8. The information preserving decoding method according to claim 7, wherein the estimating possibility $Po_{est}\{X_i=a_0\}$ of the value $a_0$ of the sample to be coded $X_i$ by a prediction operator using accurate possibility $Po_{acc}\{X_{i-d}=a_0\}$ of at least one coded sample $X_{i-d}$ with the same value $a_0$ is:

$$Po_{est}\{X_i = a_0\} = \sum_{d=1}^{M} coeff_d \cdot Po_{acc}^d\{X_{i-d} = a_0\} + coeff_0 \cdot P_{init}(a_0),$$

wherein $P_{init}(a_0)$ is an initial estimated possibility that value of sample is $a_0$, and $coeff_d$ and $coeff_0$ are weight coefficients, and d=1, 2, . . . M.

9. The information preserving decoding method according to claim 7, wherein the estimating possibility $Po_{est}\{X_i=a_0\}$ of the value $a_0$ of the sample to be coded $X_i$ by a prediction operator using accurate possibility $Po_{acc}\{X_{i-d}=a_0\}$ of at least one coded sample $X_{i-d}$ with the same value $a_0$ is: estimating the possibility $Po_{acc}\{X_{i-d}=a_0\}$ by using an exponential smoothing prediction operator below with d−1:

$$Po_{est}\{X_i = a_0\} = \begin{cases} \alpha \cdot Po_{est}\{X_{i-1} = a_0\} + (1-\alpha) \cdot Po_{acc}\{X_{i-1} = a_0\} & \text{if } i > 1 \\ P_{init}(a_0) & \text{if } i = 1 \end{cases},$$

wherein $P_{init}(a_0)$ is an initial estimated possibility that the value of the sample is $a_0$ and $\alpha$ is the smoothing rate.

10. The information preserving decoding method according to claim 9, wherein the smoothing rate is obtained by the following method:

1) carrying out statistics on correlation $R_0(d)$ between neighboring samples with a distance d from each other in a decoded sample sequence:

$$R_0(d) = \frac{1}{N} \cdot \sum_{i-N}^{1} Po_{acc}\{X_i = a_0\} \cdot Po_{acc}\{X_{i-d} = a_0\},$$

wherein N is the length of the sample sequence, and $Po_{acc}\{X_i=a_0\}$ is accurate possibility that the value of the sample $X_i$ is $a_0$;

2) fitting a correlation function $R_0(d)$ that varies with the distance d into a function of the following form:

$$R_0(d) = \begin{cases} R_0(0), & d = 0 \\ R_0(1) \cdot \beta_{long}^{d-1}, & d > 0 \end{cases}$$

to obtain a long-term declining factor $\beta_{long}$ and a short-term declining factor $\beta_{short}$ of the correlation:

$$\beta_{long}=R_0(d+1)/R_0(d), d>0,$$

$$\beta_{short}=R_0(1)/R_0(0); \text{ and}$$

3) Calculating the smoothing rate according to one of the following methods:

$$\alpha = \frac{(R_0(0) - R_0(1)) \cdot \beta_{long} - \sqrt{(R_0(0) \cdot (1 + \beta_{long}) - 2 \cdot R_0(1)) \cdot R_0(1) \cdot \beta_{long} \cdot (1 - \beta_{long})}}{R_0(0) \cdot \beta_{long}^2 - R_0(1)\beta_{long}},$$

$$\text{or } \alpha = \frac{(1 - \beta_{short}) \cdot \beta_{long} - \sqrt{(1 + \beta_{long} - 2 \cdot \beta_{short}) \cdot \beta_{long} \cdot (1 - \beta_{long})}}{\beta_{long}^2 - \beta_{short} \cdot \beta_{long}}.$$

11. The information preserving decoding method according to claim 7, further comprising:
1) determining a model number of the sample to be decoded according to context conditions of the sample to be decoded, wherein a sample with the same model number as the sample to be decoded is the same type of sample of the sample to be decoded; and
2) the said coded sample having the same type as the sample to be coded.

12. An information preserving coding device, comprising the following two devices:
1) a device for obtaining a sample to be coded and possibility distribution of value of the sample to be coded, and using accurate possibility, which has the value of either 0 or 1, of coded sample to obtain possibility distribution of value of the sample to be coded; and
2) a device for generating a bitstream according to the possibility distribution of value of the sample to be coded and the value of the sample to be coded.

13. An information preserving decoding device, comprising:
1) a device for obtaining possibility distribution of value of a sample to be decoded, and using accurate possibility, which has the value of either 0 or 1, of coded sample to obtain possibility distribution of value of the sample to be coded; and
2) a device for obtaining the value of the sample to be decoded by decoding a bitstream according to the possibility distribution of value of the sample to be decoded.

\* \* \* \* \*